US008319560B2

(12) United States Patent
Kocer et al.

(10) Patent No.: US 8,319,560 B2
(45) Date of Patent: Nov. 27, 2012

(54) SWITCHED ACTIVE BIAS CONTROL AND POWER-ON SEQUENCING CIRCUIT FOR AN AMPLIFIER

(75) Inventors: Fatih Kocer, Istanbul (TR); Yalcin Alper Eken, Istanbul (TR); Abdullah Celik, Istanbul (TR); Peter Katzin, Arlington, MA (US)

(73) Assignee: Hittite Microwave Corporation, Chelmsford, MA (US)

( * ) Notice: Subject to any disclaimer, the term of this patent is extended or adjusted under 35 U.S.C. 154(b) by 0 days.

(21) Appl. No.: 12/924,686

(22) Filed: Oct. 1, 2010

(65) Prior Publication Data

US 2011/0090014 A1    Apr. 21, 2011

Related U.S. Application Data

(60) Provisional application No. 61/278,250, filed on Oct. 5, 2009.

(51) Int. Cl.
  *H03F 3/04* (2006.01)
(52) U.S. Cl. .................................. 330/296; 330/297
(58) Field of Classification Search .................. 330/285, 330/296, 297, 51; 327/538
  See application file for complete search history.

(56) References Cited

U.S. PATENT DOCUMENTS

| 5,311,143 A | | 5/1994 | Soliday |
| 5,361,007 A | | 11/1994 | Ohta |
| 5,406,225 A | * | 4/1995 | Iida et al. ...................... 330/296 |
| 5,506,544 A | | 4/1996 | Staudinger et al. |
| 5,554,954 A | | 9/1996 | Takahashi |
| 6,081,161 A | * | 6/2000 | Dacus et al. ................... 330/297 |
| 6,429,746 B1 | * | 8/2002 | Koukkari ...................... 330/296 |
| 6,614,309 B1 | * | 9/2003 | Pehlke .......................... 330/296 |
| 6,657,499 B2 | | 12/2003 | Lin |
| 7,420,421 B1 | * | 9/2008 | Lie et al. ........................ 330/296 |
| 2003/0178976 A1 | | 9/2003 | Xi |
| 2004/0046609 A1 | * | 3/2004 | Xu ................................. 330/296 |
| 2005/0218991 A1 | * | 10/2005 | Birbeck ........................ 330/296 |
| 2006/0043945 A1 | * | 3/2006 | Sohn et al. .................... 323/273 |
| 2006/0119385 A1 | * | 6/2006 | Balasubramanian et al. .. 326/38 |
| 2007/0029975 A1 | | 2/2007 | Martin et al. |
| 2008/0094101 A1 | | 4/2008 | Balasubramanian et al. |
| 2009/0033298 A1 | | 2/2009 | Kleveland |

OTHER PUBLICATIONS

STMicroelectronics, Datasheet STLA01, "50 mA stand-alone linear LED driver", www.st.com, Nov. 2007, Rev. 1, 16 pgs.
Web page, http://electronicdesign.com/article/power/gaasfet-power-supply-has-negative-gate-bias-automa.aspx, "GaAsFET Power Supply Has Negative Gate Bias, Automatic Power-Up Sequencing", Oct. 4, 1999, 2 pgs.
ZETEX, Datasheet ZNBG2000 ZNBG2001, "FET Bias Controller", www.zetex.com, Issue 1, Aug. 2001, 7 pgs.
Sumitomo Electric, Technical Note, "P0110003P 800mW GaAs Power FET", www.sei.co.jp/GaAsIC/, Sep. 2003, 13 pgs.

(Continued)

*Primary Examiner* — Khanh V Nguyen
(74) *Attorney, Agent, or Firm* — Iandiorio Teska & Coleman, LLP

(57) ABSTRACT

An active bias control circuit for an amplifier includes a switch responsive to a supply voltage for providing an input current to the input of the amplifier, and a current sense circuit coupled to the switch for sensing a scaled down replica of the input current to the amplifier. A first amplifier control circuit is responsive to the current sense circuit for adjusting a first control voltage to the amplifier in response to the sensed, scaled down replica of the input current to regulate the input current to the amplifier. Circuitry for power up sequencing an amplifier for an active bias control circuit for the amplifier is also disclosed.

40 Claims, 22 Drawing Sheets

OTHER PUBLICATIONS

Agilent Technologies, Application Note, "2.0 GHz high-linearity second stage LNA/driver using Agilent ATF-53189", www.agilent.com/semiconductors, Sep. 9, 2005, 14 pgs.

Infineon Technologies, Datasheet, "BCR400W Active Bias Controller", www.infineon.com, Aug. 7, 2001, 7 pgs.

Written Opinion of the International Searching Authority, PCT Application No. PCT/US2010/002678, mailed Dec. 9, 2010, 5 pgs. (unnumbered).

Zhiming et al., "A 1.8 V LDO voltage regulator with foldback current limit and thermal protection", 2009 Chinese Institute of Electronics, Journal of Semiconductors, vol. 30, No. 8, 5 pgs.

Written Opinion of the International Searching Authority, PCT Application No. PCT/US2010/002679, mailed Dec. 9, 2010, 7 pgs. (unnumbered).

* cited by examiner

| SW2 | SW1 | 1bias |
|---|---|---|
| 0 | 0 | 200mA-400mA |
| 0 | 1 | 400mA-800mA |
| 1 | 0 | 800mA-1600mA |
| 1 | 1 | 1600mA-2000mA |

*FIG. 4*

SWITCHED ACTIVE BIAS CONTROL AND POWER-ON SEQUENCING CIRCUIT FOR AN AMPLIFIER

RELATED APPLICATIONS

This application hereby claims the benefit of and priority to U.S. Provisional Patent Appl. No. 61/278,250, filed on Oct. 5, 2009 under 35 U.S.C. §§119, 120, 363, 365, and 37 C.F.R. §1.55 and §1.78, which application is incorporated herein by reference. This application is also related to the application filed on even date herewith entitled "Active Bias Control Circuit for an Amplifier and Method of Power Up Sequencing the Same", which is also incorporated herein by reference.

FIELD OF THE INVENTION

The subject invention relates to an active bias control circuit for an amplifier.

BACKGROUND OF THE INVENTION

Amplifiers are one of the main building blocks of any system that receives or transmits signals. They may be used to amplify a received signal to increase the signal strength and improve the signal to noise ratio (SNR), and may be used in transmitter chains to amplify signals to acceptable levels to drive antennae. They may also be used between system blocks to amplify a signal as desired.

A typical amplifier includes one or more transistors. These transistors could be any kind (bipolar, MOSFET, MESFET, JFET, etc.) and can be of any mode (depletion or enhancement type), depending on the specific needs of the application. Regardless of the type and mode of the amplifier, the transistor used in the amplifier should be biased at its gate or its base in order to achieve active operation. The bias point affects many parameters of the amplifier such as, efficiency, noise figure, linearity, stability and gain. However, every transistor is different from each other. Their threshold (pinch-off) value varies from part to part due to process variation, as well as aging and temperature. In order to compensate for these changes, quiescent bias through amplifiers should be monitored and their gate or base voltage preferably adjusted constantly to achieve stable operation.

An active bias control is a feedback system that typically measures the quiescent bias through a transistor and adjusts the gate or base of the amplifier to achieve a stable bias point. Many system level and on-chip active bias control loops have been designed and published over the years.

U.S. Pat. No. 5,361,007 to Ohta discloses an apparatus for generating a stable amplifier gate voltage by sensing the current passing through the amplifier by using a sense resistor in series with the amplifier (connected to the drain or collector) and using feedback to keep the voltage across this sense resistor constant. U.S. Pat. No. 5,311,143 to Soliday discloses another sensing apparatus which connects the sense resistor to the emitter of the amplifier rather than the collector. U.S. Pat. No. 6,657,499 to Lin discloses a bias generation circuit that uses a sense resistor connected in series with the amplifier.

These prior systems described above use a sense resistor in series with the RF amplifier which is desirable to avoid since the total quiescent current of the amplifier is also passing through the sense resistor thereby dissipating extra power. Accurate current setting requires very accurate trimming of the sense resistor. If the quiescent current of the amplifier is large (>1 A, which is the case for driver amplifiers) the sense resistor should be large enough to handle the current as well as accurate enough not to cause part to part variation.

Another important consideration for amplifiers is the proper power-up/power-down sequence to be applied to the amplifier. If a drain voltage is applied before the bias generator is properly turned on, excessive current will pass through the amplifier, possibly damaging it.

BRIEF SUMMARY OF THE INVENTION

It is therefore an object of this invention to provide an active bias control circuit for an amplifier that does not rely on the use of a sense resistor in series with the amplifier.

It is a further object of this invention to provide an improved method of power up sequencing an active bias control circuit for an amplifier.

The subject invention, however, in other embodiments, need not achieve all these objectives and the claims hereof should not be limited to structures or methods capable of achieving these objectives.

The invention results in part from the realization that for an active bias control circuit, rather than using a low value sense resistor in series with the supply input of an external amplifier to sense the input current provided to the external amplifier for adjusting the amplifier's control voltage, it is more advantageous to determine the input current by sensing the current from a scaled down replica of the input current to the amplifier. Embodiments of this invention makes use of the voltage drop across a supply switch to provide a scaled-down replica of the supply current through the amplifier thereby eliminating the need for a separate series sense resistor.

SUMMARY OF THE INVENTION

This invention features an active bias control circuit for an amplifier, including a switch responsive to a supply voltage for providing an input current to the input of the amplifier. A current sense circuit is coupled to the switch for sensing a scaled down replica of the input current to the amplifier, and a first amplifier control circuit responsive to the current sense circuit for adjusting a first control voltage to the amplifier in response to the sensed, scaled down replica of the input current to regulate the input current to the amplifier.

In one embodiment, the switch may include a switching transistor. The active bias control circuit may include a level shifter for biasing the switching transistor. The sense circuit may include a sensing transistor having its control terminal coupled to the control terminal of the switching transistor for providing the scaled down replica of the input current to the amplifier. The current sense circuit may include a sense resistor responsive to the sensing transistor for providing a voltage corresponding to the scaled down replica of the input current to the amplifier. The active bias control circuit may include a feedback amplifier having its inputs coupled to the drains of the switching and sensing transistors, and a transistor coupled between the sensing transistor and the sense resistor and having a control terminal responsive to an output of the feedback amplifier for improving the current scaling accuracy of the switching and sensing transistors. The active bias control circuit may include a feedback amplifier having its inputs coupled to the drains of the switching and sensing transistors, the first amplifier control circuit responsive to the feedback amplifier for adjusting the first control voltage to the amplifier in response to the sensed, scaled down replica of the input current to regulate the input current to the amplifier. The active bias control circuit may include a second amplifier control circuit for adjusting a second control voltage to the amplifier. The active bias control circuit may include a low dropout regulator including an error amplifier responsive to a reference voltage, and a pass transistor responsive to the error amplifier for providing the supply voltage to the switch. The pass transistor, the low dropout regulator and the sense circuit may be located on an integrated circuit. The low dropout regulator and the sense circuit may be located on an integrated circuit and the pass transistor is located external to the integrated circuit. The active bias control circuit may include one or more additional switching transistors each coupled to the switching transistor and responsive to the supply voltage for providing an input current to the input of the amplifier. The active bias control circuit may include one or more additional sensing transistors each coupled to the sensing transistor and responsive to the supply voltage for providing the scaled down replica of the input current to the amplifier. The active bias control circuit may include one or more additional switching transistors each coupled to the switching transistor and responsive to the supply voltage for providing an input current to the input of the amplifier. The amplifier control circuit may be configured to provide either a positive or negative control voltage. The switching and sensing transistors may be on the same integrated circuit and have their characteristics matched over process, temperature, and voltage variations. The circuit may be on an integrated circuit chip, and the amplifier control circuit may be configured to: provide a control voltage for an amplifier including either an enhancement mode or depletion mode device, operate using a negative voltage supply generated either on the integrated circuit chip or externally, and/or provide either a fixed control voltage or adjust the control voltage in response to the determined input current to keep the input current to the amplifier constant. The active bias control circuit may include a third control circuit configured to enable the active bias control circuit. The active bias control circuit in which the amplifier control circuit is configured externally by user accessible pins connected to the integrated circuit chip. The third control circuit may be configured to: control a control voltage of the amplifier to bring the amplifier control voltage below pinch off, generate a first enable signal to enable drain current to flow to the amplifier, generate a second enable signal when the drain voltage is stabilized, and in response to the second enable signal, increase the control voltage to achieve a predetermined amplifier input current. The third control circuit may be configured to generate a trigger out signal after the predetermined amplifier input current is achieved. The first enable signal may turn on a switch to enable the drain current to flow to the amplifier. The second enable signal may turn on an amplifier control circuit to stabilize the drain current. The circuit may be placed in a standby mode if a control terminal of the amplifier is shorted to ground. The circuit may be placed in a standby mode if a drain terminal of the amplifier is shorted to ground.

This invention also features an active bias control circuit for a plurality of amplifiers, including a plurality of bias control circuits each responsive to a supply voltage and each one corresponding to an amplifier, each control circuit including: a switch responsive to the supply voltage for providing an input current to the corresponding amplifier. A current sense circuit is coupled to the switch for sensing a scaled down replica of the input current to the corresponding amplifier, and an amplifier control circuit provides a control voltage to the corresponding amplifier and adjusting the control voltage in response to the sensed scaled down replica of the input current to regulate the input current to the corresponding amplifier.

This invention also features an active bias control circuit for a plurality of amplifiers, including a plurality of bias control circuits each responsive to a corresponding supply voltage and each one corresponding to an amplifier, each control circuit including: a switch responsive to the corresponding supply voltage for providing an input current to the corresponding amplifier. A current sense circuit is coupled to the switch for sensing a scaled down replica of the input current to the corresponding amplifier, and an amplifier control circuit for providing a control voltage to the corresponding amplifier and adjusting the control voltage in response to the sensed scaled down replica of the input current to regulate the input current to the corresponding amplifier.

This invention further features an active bias control circuit for an amplifier, including a low dropout regulator for providing a regulated voltage. A switch is responsive to the low dropout regulator and providing an input current to the amplifier. A current sense circuit is responsive to the low dropout regulator for sensing a scaled down replica of the input current to the amplifier, and an amplifier control circuit for providing a control voltage to the amplifier and adjusting the control voltage in response to the sensed scaled down replica of the input current to regulate the input current to the amplifier.

This invention also features an active bias control circuit for a plurality of amplifiers, including a low dropout regulator for providing a regulated voltage. A plurality of bias control circuits each one corresponding to an amplifier, each control circuit including: a switch responsive to the low dropout regulator for providing an input current to the corresponding amplifier. A current sense circuit is responsive to the low dropout regulator for sensing a scaled down replica of the input current to the corresponding amplifier, and an amplifier control circuit for providing a control voltage to the corresponding amplifier and adjusting the control voltage in response to the sensed scaled down replica of the input current to regulate the input current to the corresponding amplifier.

In one embodiment, the active bias control circuit in which the low dropout regulator may include an error amplifier responsive to a reference voltage, and a pass transistor responsive to the error amplifier. The pass transistor may be located on-chip with the low dropout regulator. The pass transistor may be located external to the chip.

BRIEF DESCRIPTION OF THE SEVERAL VIEWS OF THE DRAWINGS

Other objects, features and advantages will occur to those skilled in the art from the following description of a preferred embodiment and the accompanying drawings, in which:

FIG. 4 is a table of exemplary drain bias currents for the second embodiment of the switching and sensing transistors of the active bias control circuit of FIG. 3;

DETAILED DESCRIPTION OF THE INVENTION

Figure 1:
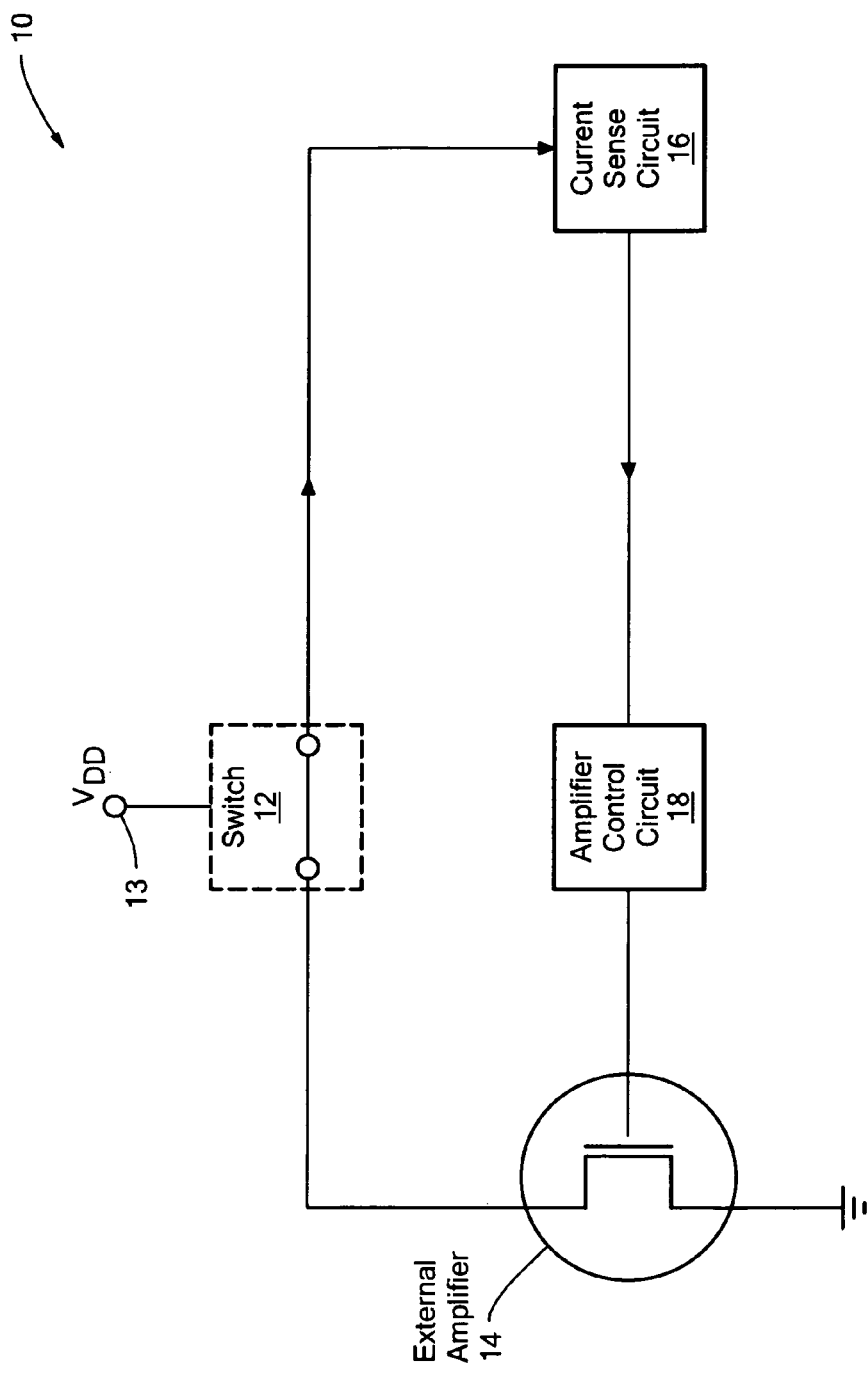
FIG. 1 is a block diagram showing an active bias control circuit in accordance with the subject invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

An active bias control circuit 10 in accordance with the invention is shown in FIG. 1. Active bias control circuit 10 includes a switch 12 such as a switching transistor that is responsive to a supply voltage Vdd 13 for providing an input supply to an amplifier 14, which may be an external amplifier. To avoid the use of a sense resistor in series with amplifier 14, a current sense circuit 16 is responsive to switch 12 and is used to sense the input current to amplifier 14 and provide a scaled-down replica of this input current to the amplifier. An amplifier control circuit 18 is responsive to current sense circuit 16 and provides a control voltage to amplifier 14 to adjust the control voltage based upon the sensed scaled-down replica of the input current. By adjusting the control voltage of amplifier 14, the input supply to amplifier 14 is thereby regulated. Although amplifier 14 is shown in FIG. 1 as a FET amplifier having the control voltage at its gate adjusted, amplifier 14 could be any type of transistor such as a bipolar, IGBT, etc., and could be a depletion or enhancement FET type transistor.

Figure 2:
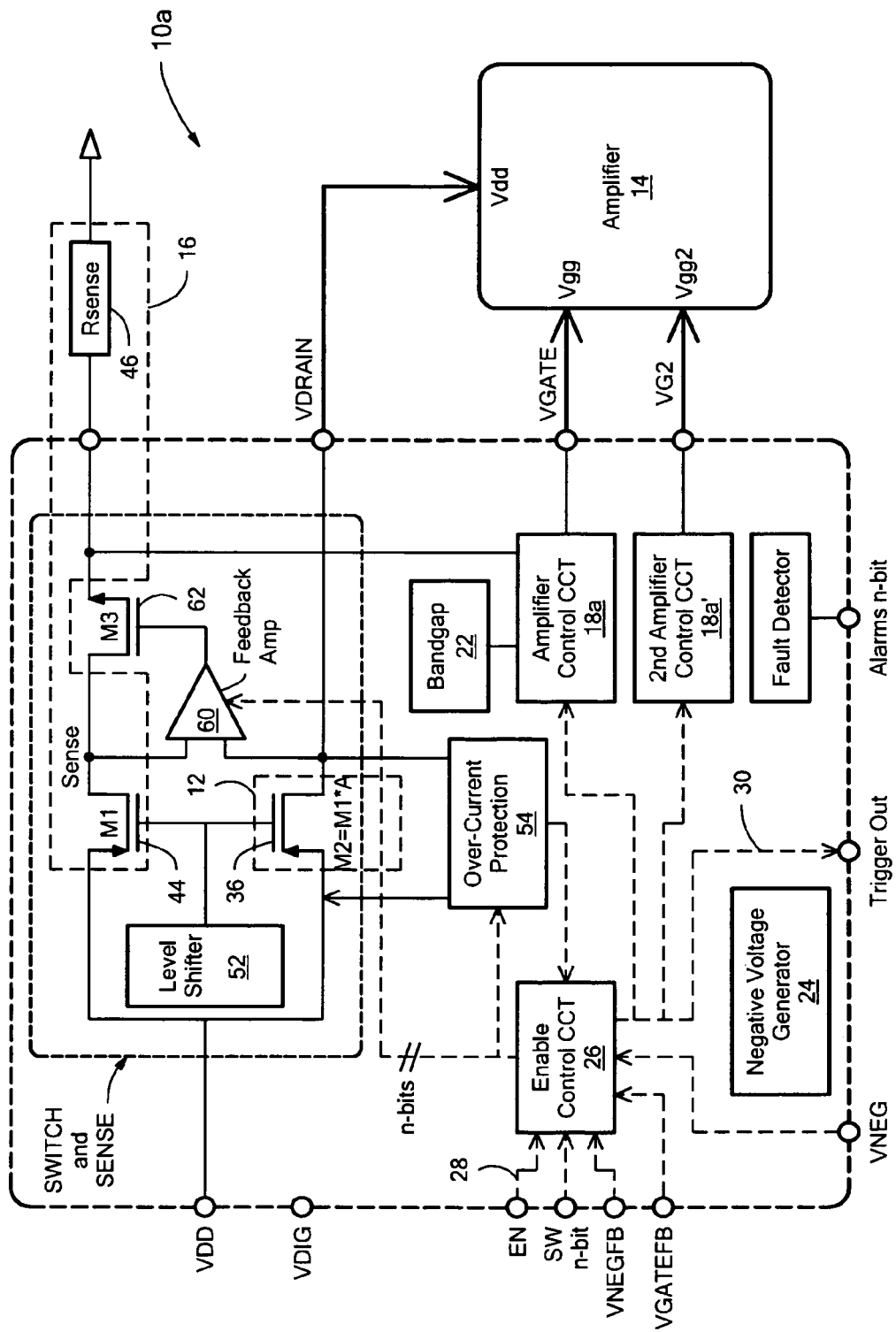
FIG. 2 is a schematic diagram of one embodiment of the active bias control circuit of FIG. 1.

Another embodiment of the active bias control circuit 10a, FIG. 2, includes a bandgap reference circuit 22 that generates a reference voltage for amplifier control circuit 18 and may generate other reference voltages and currents which are very stable over the external supply input voltage, temperature, and process variations. Active bias control circuit 10a also includes a negative voltage generator 24 which generates a stable negative voltage that can bias an amplifier using a depletion mode device. The output of negative voltage generator 24 is preferably externally adjustable and may be disabled if an external negative supply is already available or not required. Circuit 10a also includes an enable control circuit 26 to enable the active bias control system 10a in response to an ENABLE signal on line 28. Circuit 26 may be used to safely turn on external amplifier 14, as further described below, and to generate a trigger out signal on line 30 once an acceptable quiescent point is achieved for the amplifier 14. A second amplifier control circuit 18a' may also be provided that is not responsive to the sensed, scaled down replica of the input current, but rather has its output voltage adjusted by a user accessible pin. The second amplifier control circuit 18a' can be used to bias amplifiers that use cascode architecture and requires a second control voltage. The components of active bias control circuit 10a may be manufactured on an integrated circuit (IC) 34 having the connections as shown in FIG. 2 with amplifier 14 external to IC 34 as shown.

Switch 12 includes a switching transistor 36 for providing the input supply to amplifier 14. Level shifter circuit 52 biases the gate of switching transistor 36. Over-current protection circuit 54 monitors the current through switching transistor 50 for any over-current fault and generates fault and enable signals for the rest of circuit 10a.

Sense circuit 16 includes a sensing transistor 44 having its gate coupled to the gate of transistor 36 for providing a scaled-down replica of the output current of transistor 36. To provide a scaled-down reference of the output current from transistor 36, the ON-resistance (Ron) of transistor 36 is significantly smaller than the Ron of transistor 44. For example, transistor 36 may have an Ron that is 200 times less than the Ron of transistor 44. Preferably, transistors 36 and 44 are on the same integrated circuit and their characteristics are well matched over process, temperature, and voltage variations. Current sense circuit 16a also includes a sense resistor 46 responsive to transistor 44 for providing a voltage corresponding to the scaled-down replica of the input current to amplifier 14.

Active bias control circuit 10a also includes a feedback amplifier 60 connected to the drains of transistors 36 and 44. An additional transistor 62 is located in series between transistor 44 and sense resistor 46, and has its gate connected to the output of feedback amplifier 60. Due to the feedback created by feedback amplifier 60, the voltage on the drains of transistors 36 and 44 equal to each other which forces the voltage drop across transistors 36 and 44 to be equal to each other. This feedback scheme enables the voltage across sense resistor 46 to be much lower than the voltage supplied to amplifier 14 via the VDRAIN pin, thereby simplifying the design of the input amplifier of control circuit 18a. Transistor 62 is shown as being an NMOS transistor, but this is not a limitation of the invention as any type of transistor (PMOS, NPN, PNP, etc.) could also be used.

Amplifier control circuit 18a is coupled to sense resistor 46 and is responsive to the voltage across resistor 46 for controlling the control voltage of amplifier 14. In this manner, by sensing the voltage across sense resistor 46 which is representative of a scaled-down replica of the input current to amplifier 14, a low value current sense resistor is not required in series with the drain or source of amplifier 14, thereby eliminating the disadvantages associated with using such a sense resistor. In order not to damage amplifier 14, it is preferable to keep the amplifier at pinch off until the drain voltage is stabilized. When the drain voltage is stabilized, the gate voltage of amplifier 14 is increased to obtain the desired quiescent current. To accomplish this, active bias control circuit 10a uses enable control circuit 26 to monitor different components of circuit 10a to enable amplifier 14 in an appropriate manner and to also shut off amplifier 14 in the event of a system failure. User accessible pins VNEGFB and VGATEFB may each serve a dual purpose in that they can be shorted to ground to configure the various operating modes as described below. They can also be used to adjust the output voltage level of negative voltage generator 24 in the depletion mode and of the trigger point for the gate voltage Vset threshold for power up sequencing.

Figure 3:
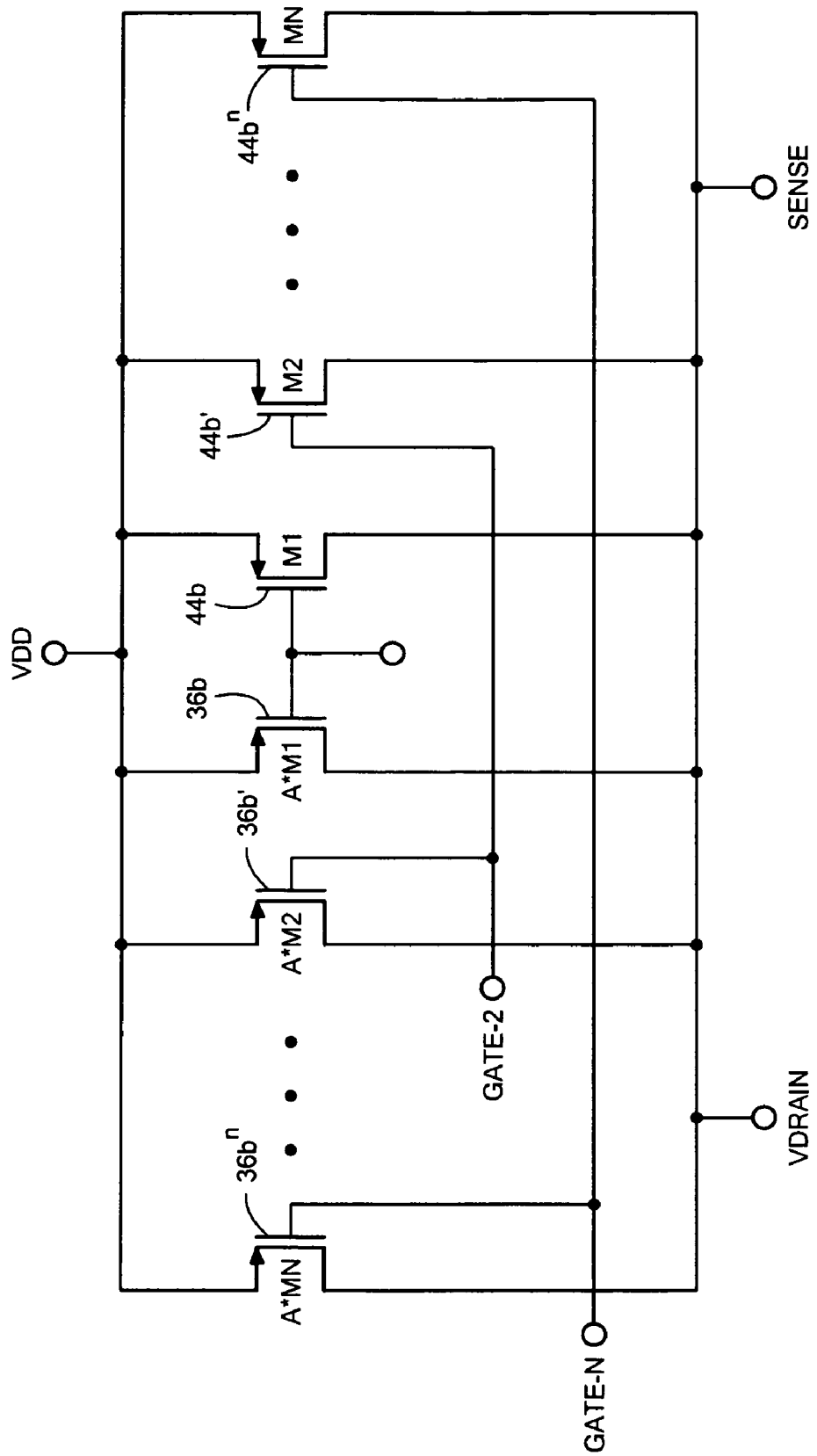
FIG. 3 is a schematic diagram of second embodiment of the switching and sensing transistors of the active bias control circuit of FIG. 2.

To further increase scaling accuracy, a plurality of both switching transistors and/or sensing transistors may be used. FIG. 3 shows the arrangement of a plurality of switching transistors 36b, 36b' . . . 36b$^n$ and a plurality of sensing transistors 44b, 44b' . . . 44b$^n$. A user selectable N-bit switch may be used to allow a user to select the number of transistors used to set the bias current. FIG. 4 is an exemplary selection table for a 2-bit switch that would allow a user to select a stable bias current from between 200 mA to 2 A by selecting the appropriate switches.

Figure 5:
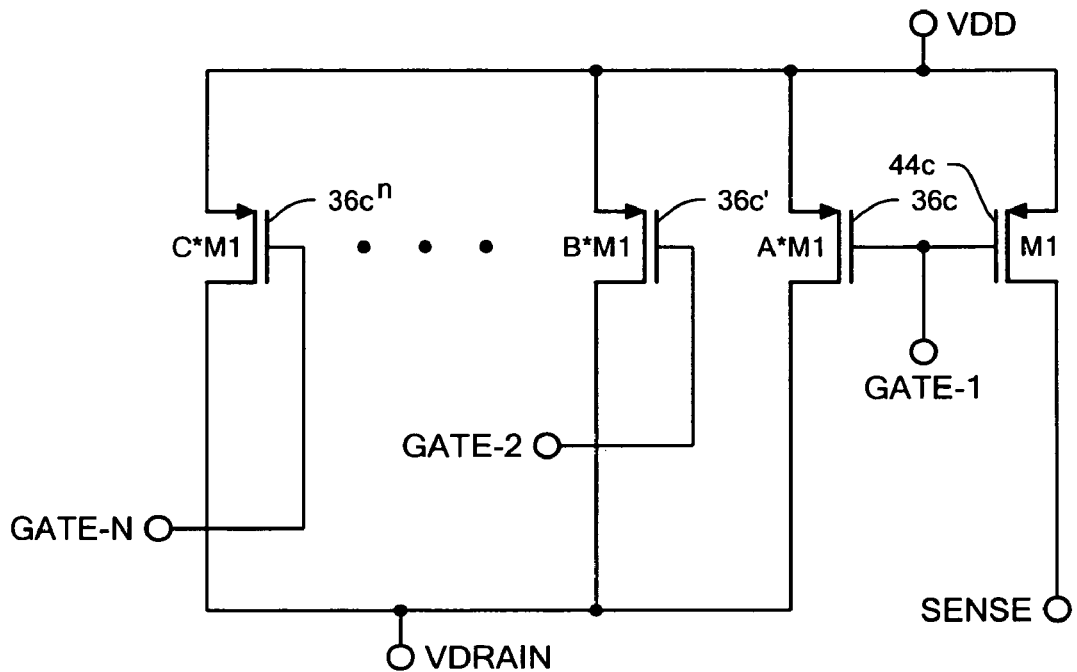
FIG. 5 is a schematic diagram of a third embodiment of the switching and sensing transistors of the active bias control circuit of FIG. 2.

The arrangement of transistors shown in FIG. 3 is exemplary, as a plurality of switching transistors 36c, 36c' . . . 36c$^n$, FIG. 5, and a single sensing transistor 44c may also be used. In this embodiment, the ratio of sense transistors to switch transistors may be modified during operation. An n-bit binary code may be used to select the number of switching transistors 36c, 36c' . . . 36c$^n$, while the number of one or more sense transistors 44c remains constant. Thus, the sense current can be modified (i.e., modulated) with a change in binary code, without changing the sense resistor value. This technique may be used in a system where a dynamic quiescent bias change is required and it is desirable to achieve it through the use of a binary code. The Ron of transistors 36c, 36c' . . . 36c$^n$ may be the same as each other or they may have different Ron values from each other.

Figure 6:
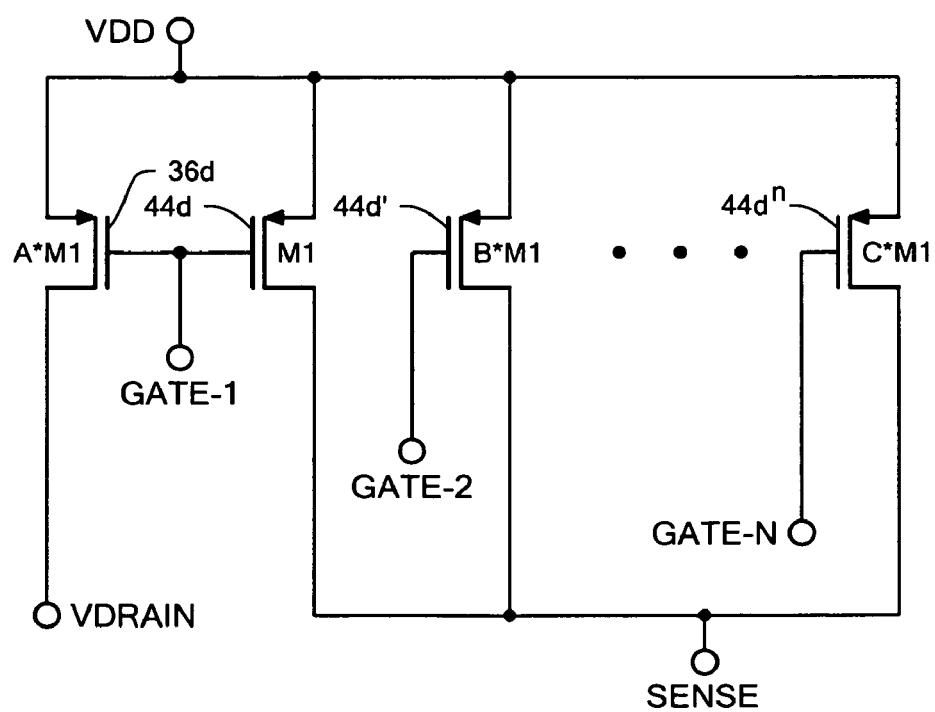
FIG. 6 is a schematic diagram of a fourth embodiment of the switching and sensing transistors of the active bias control circuit of FIG. 2.

A single switching transistor 36d, FIG. 6, and a plurality of sensing transistors 44d, 44d' . . . 44d$^n$ may also be used. In this embodiment, the quiescent current may be modified with a binary code to change the number of sensing transistors 44d, 44d' . . . 44d$^n$.

Figure 7:
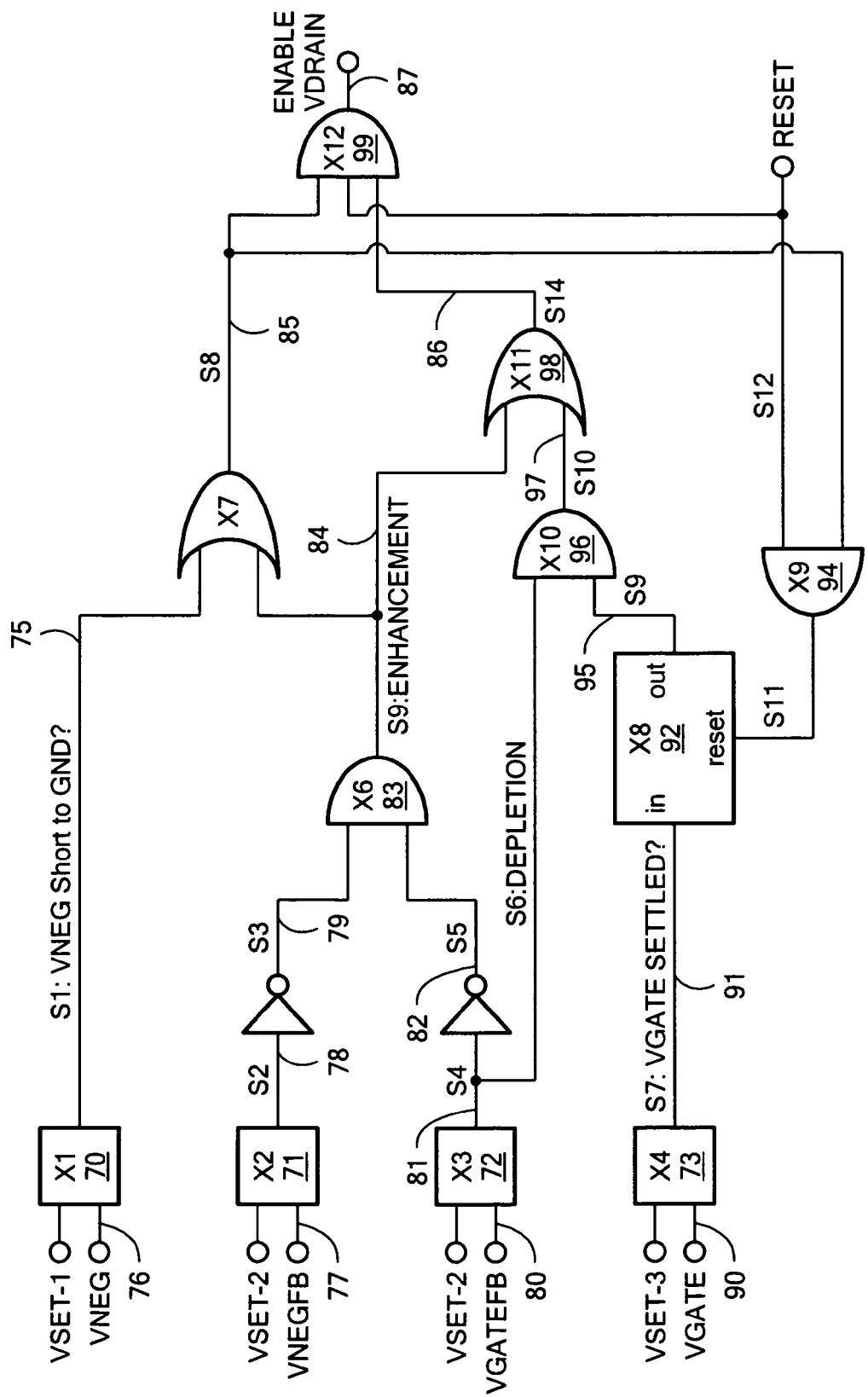
FIG. 7 is a schematic diagram of the enable control circuit of the active bias control circuit of FIG. 2.

One embodiment of enable control circuit 26d, FIG. 7, includes five comparators 70-74. Comparator 70 is responsive to the VNEG signal on line 76 and VSET-1 signal. Signals VSET-1 through VSET-3 are generated by bandgap generator 22. If the VNEG signal is above VSET-1, comparator 70 generates LOW on line 75 which indicates a short to ground on line 76.

Comparator 71 is responsive to the VNEGFB signal on line 77, which is coupled to a user accessible terminal, and the VSET-2 signal. If the VNEGFB signal on line 77 is shorted to ground which indicates the user's intention to turn off negative voltage generator 24, the output of comparator 71 goes LOW on line 78 and line 79 goes HIGH. This turns off negative voltage generator 24 setting the system either in an ENHANCEMENT mode or a DEPLETION SLAVE mode. If line 77 is not grounded, line 78 goes HIGH and line 79 goes LOW placing the system in a DEPLETION MASTER mode, turning on negative voltage generator 24.

Comparator 72 is responsive to the VGATEFB signal on line 80, which is also coupled to a user accessible terminal, and the VSET-2 signal. If line 80 is shorted to ground which indicates the user's intention to put the system in the ENHANCEMENT mode, the output of comparator 74 goes LOW on line 81 and line 82 goes HIGH. If line 80 is not grounded, line 81 goes HIGH and line 82 goes low, placing the system in a. DEPLETION mode.

AND gate 83 is responsive to the signals on lines 79 and 82. If the signals on lines 79 and 82 are HIGH (both VNEGFB on line 80 and VGATEFB on line 77 are shorted to ground), line 84 goes high placing the system in the ENHANCEMENT mode. If line 84 is HIGH, line 85 goes HIGH, 86 goes HIGH making the output on line 87 go HIGH, which provides an ENABLE VDRAIN signal to turn on the system. If line 84 is low, the system is in DEPLETION MODE and the ENABLE VDRAIN signal on line 87 needs the information from the other comparators to go HIGH to enable the system.

Comparator 73 is responsive to the VNEG signal on line 88 and the VSET-3 signal. When the VNEG signal is lower than VSET-3, the signal on line 89 goes HIGH which indicates that VNEG has settled and achieved a predetermined value.

Comparator 74 is responsive to the VGATE signal on line 90 and the VSET-3 signal. When the VGATE signal is lower than VSET-3, the signal line 91 goes HIGH which indicates that VGATE has settled and achieved a predetermined value. LATCH 92 is responsive to the signal on line 91. Its output value on signal line 95 stays LOW, until its input on signal line 91 goes HIGH. When line 91 goes high, line 95 goes HIGH and stays HIGH regardless of the value of line 91 until cleared to LOW by a LOW signal on its reset input of latch 92. AND gate 94 is responsive to the signals on lines 93 and 89 and generates a HIGH signal on line 95 when both the VNEG and VGATE signals have settled to their predetermined values. AND gate 96 is responsive to the signals on lines 81 and 95 and generates a HIGH signal on 97 when the system is in the DEPLETION MODE and the VNEG and VGATE signals have settled. OR gate 98 is responsive to the signals on lines 84 and 97 and generates a HIGH signal on line 86 when the system is in the ENHACEMENT mode or if the system is in the DEPLETION mode and the VNEG and VGATE signals have settled. AND gate 99 is responsive to the signal on lines 85 and 86 and generates a HIGH signal on line 87 to provide an ENABLE VDRAIN signal when lines 85 and 86 go HIGH.

To summarize, in order for the ENABLE VDRAIN signal to go HIGH on line 87 to enable the drain current, one of these conditions should be satisfied: 1) the system is in ENHANCEMENT MODE; or 2) the system is in DEPLETION MODE, the VGATE and VNEG signals have settled down and the VNEG signal is not shorted to ground.

Figure 8:
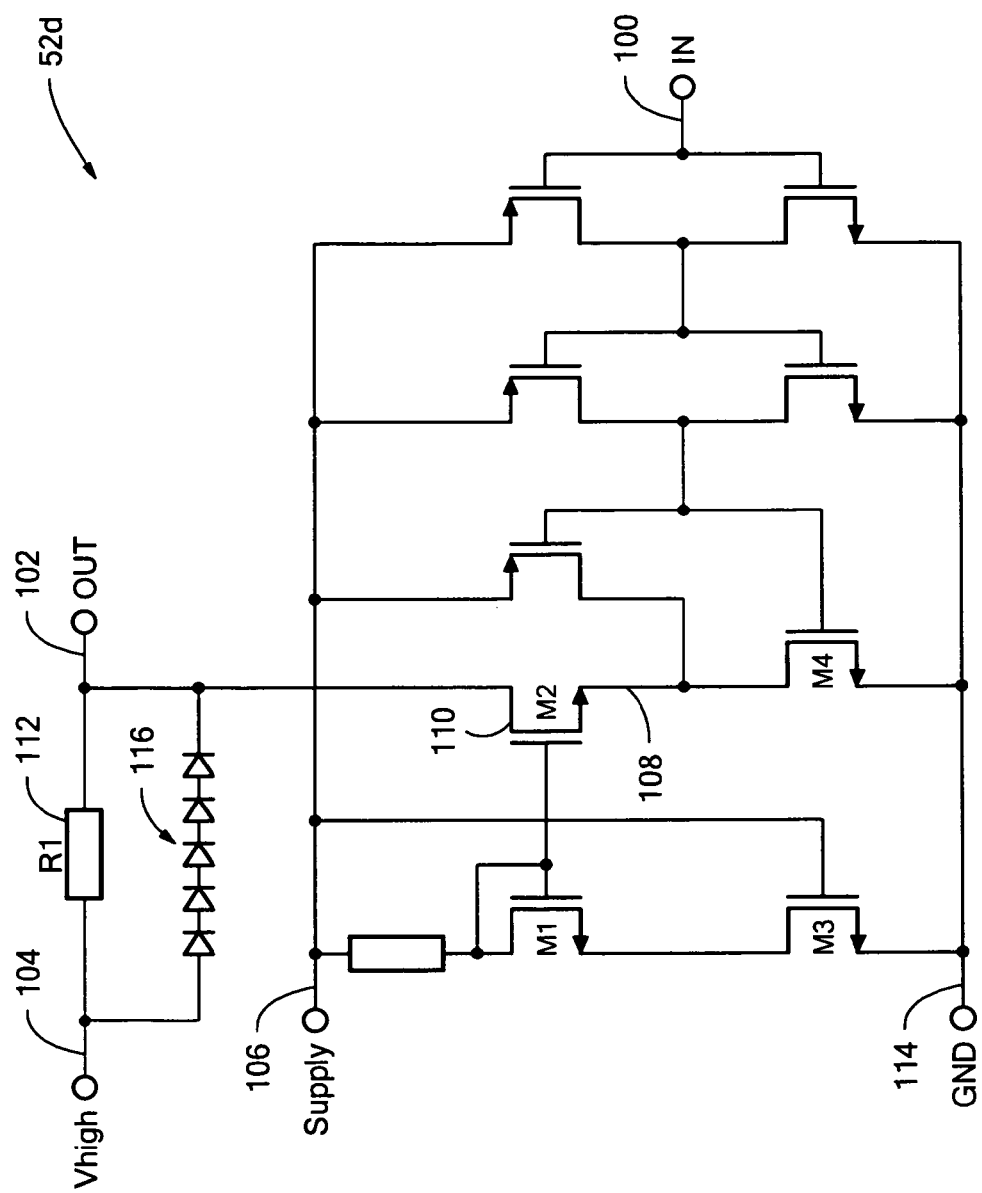
FIG. 8 is a schematic diagram of the level shifter of the above bias control circuit of FIG. 2.

The output of enable control circuit 26 is provided to level shifter 52, FIG. 2. One embodiment of level shifter 52d is shown in FIG. 8. Level shifter 52d receives input signal on line 100 and generates an output signal on line 102 which is supplied to the gate of switching transistor 50, FIG. 3. Line 104 is connected to VDD. The supply voltage provided to level shifter 52 on line 106 is typically 5 V.

When the input 100 is low, node 108 is pulled up to the voltage on supply line 106, which turns off transistor 110. When transistor 110 is off, no current is flowing through resistor 112. The output on line 102 becomes equal to the voltage Vhigh on line 104, thereby turning off switching transistor 36, FIG. 3.

When the input voltage on line 100 is high, node 108 is pulled down to ground on line 114, which turns transistor 110 on. The voltage drop across resistor 112 then becomes sufficient to turn on switching transistor 50. The series of diodes 116 is provided as a safety precaution to clamp a gate voltage of switching transistor 50 to a sufficiently low value. A plurality of level shifter 52b circuits may also be used to drive multiple gates in FIGS. 3, 4, and 5. In this arrangement, a decoder (not shown) is used to allow the selection of the desired biasing circuits for either the drain or the sense.

Figure 9:
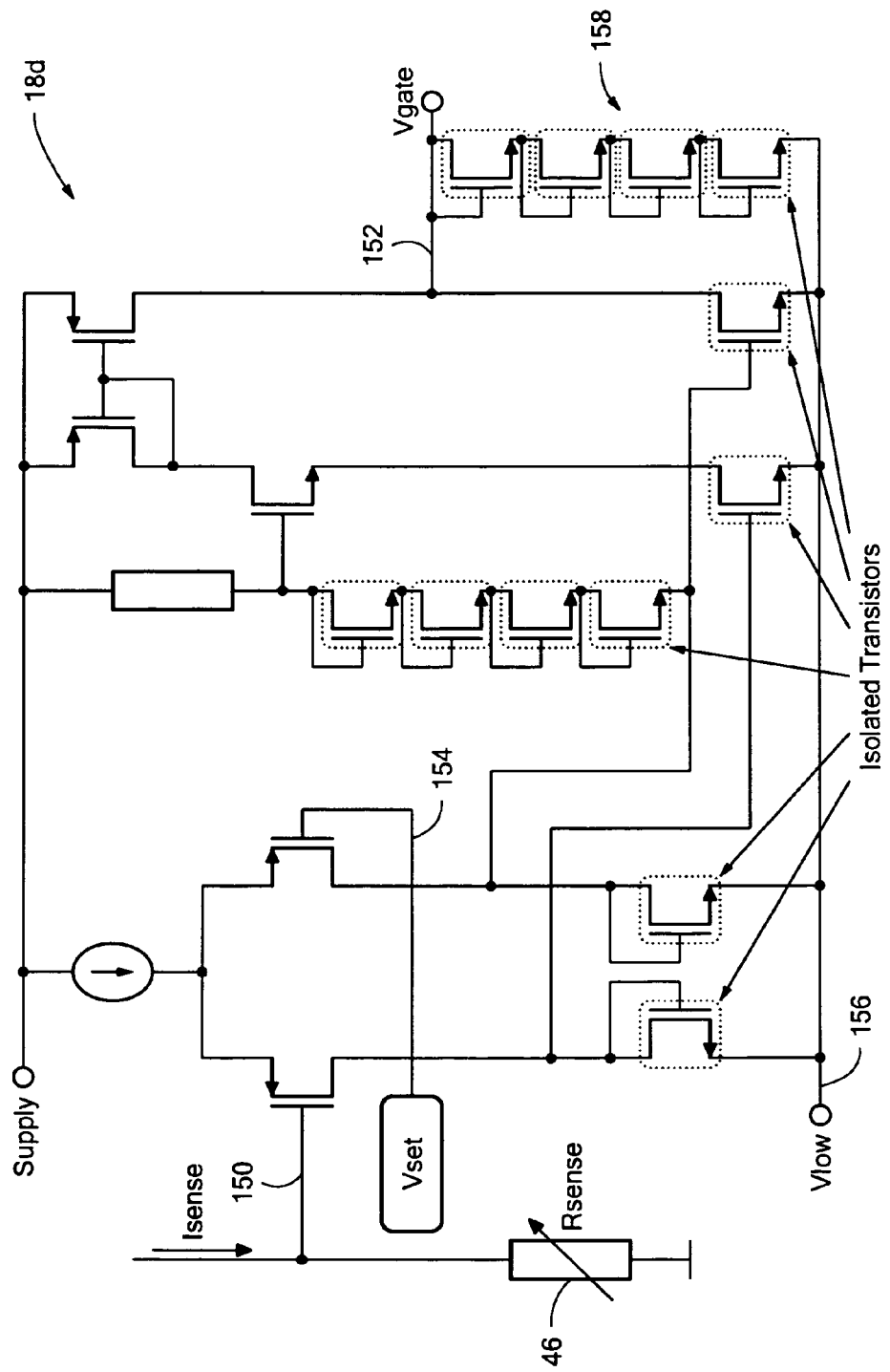
FIG. 9 is a schematic diagram of the amplifier control circuit of the active bias control circuit of FIG. 2.

Amplifier control circuit 18b, FIG. 9, is responsive to the voltage across sense resistor 46, which provides a scaled down replica of the input current to the amplifier 14. The voltage of sense resistor 46 is sensed on line 150. Amplifier control circuit 18d adjusts its output on line 152 until the voltage from Vset on line 154 is equal to the sensed voltage on line 150.

When the active bias control circuit 10b is set to bias a depletion mode device, line 156 is connected to a negative voltage supply. The output 152 of active bias control circuit 10b is maintained at the voltage value on line 156 until the system is enabled, which keeps the depletion mode device at pinch off. When the system is enabled, the output 152 is increased until a desired quiescent bias is achieved. The shunt transistors 158 connected between output 158 and line 156 clamp the output voltage on line 152 about 4 V above the voltage on line 156.

When active bias control circuit is set to bias enhancement mode device, line 156 is connected to ground which maintains the output 152 at ground until the system is disabled, which keeps the enhancement mode device at pinch off. When the system is enabled, the output voltage on line 152 is increased until the quiescent bias is achieved.

Since the active bias control circuit 10b can bias both enhancement and depletion mode devices, amplifier control circuit 18d is preferably capable of generating both negative and positive output voltages on line 152. Typical CMOS transistors may not allow negative voltages with respect to an integrated circuit substrate to be applied. To allow the use of negative voltages, isolated NMOS transistors that can withstand negative voltages values are preferably used.

Figure 10:
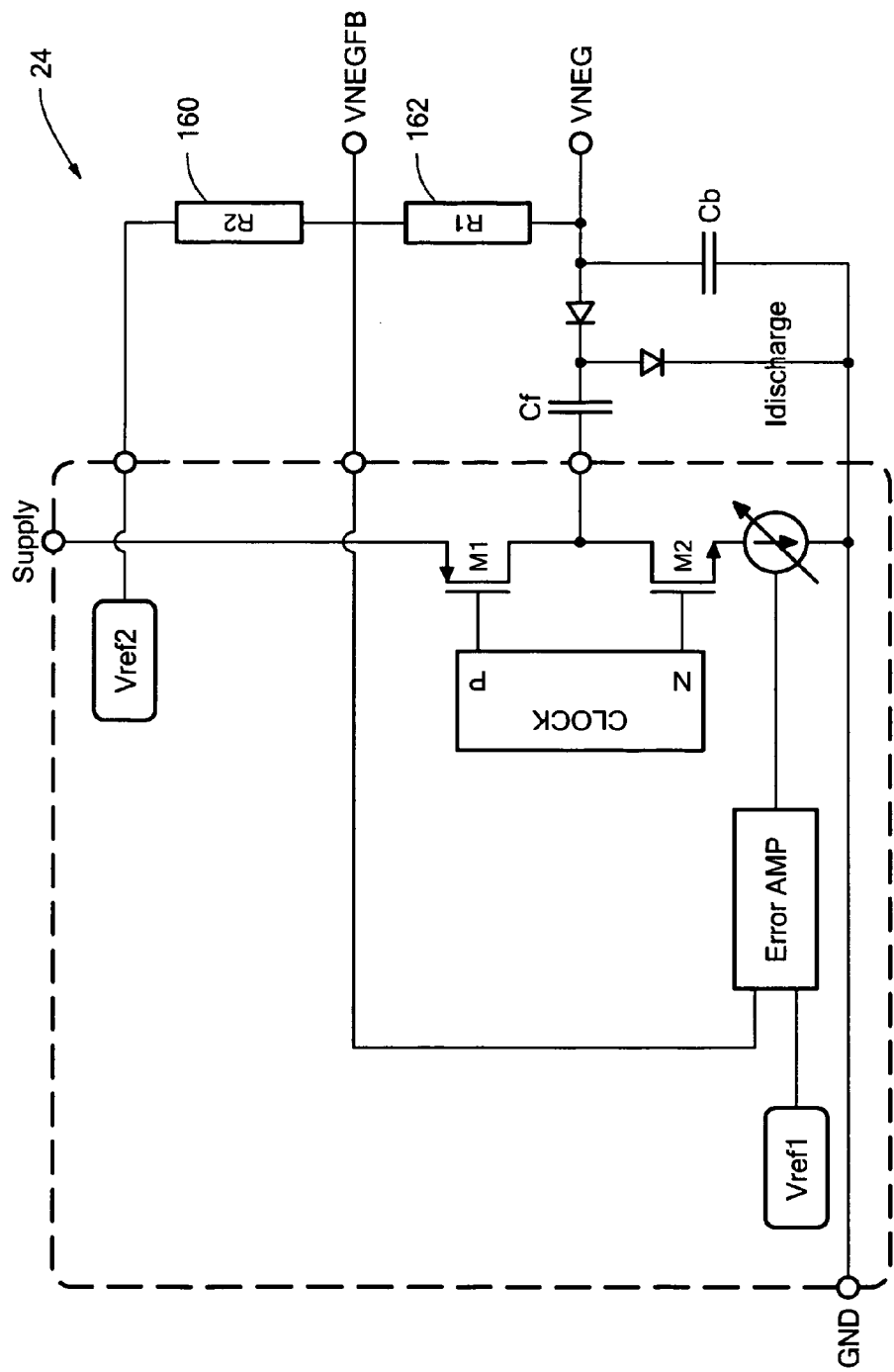
FIG. 10 is a schematic diagram of the negative voltage generator of the active bias control circuit of FIG. 2.

One embodiment of negative voltage generator 24, FIG. 10, includes resistors 160 and 162 which can be located either on chip or off chip to adjust the value of voltage output of generator 24. FIG. 10 illustrates an embodiment of the drain current check circuit 54 of circuits 10b and 10c.

Figure 11:
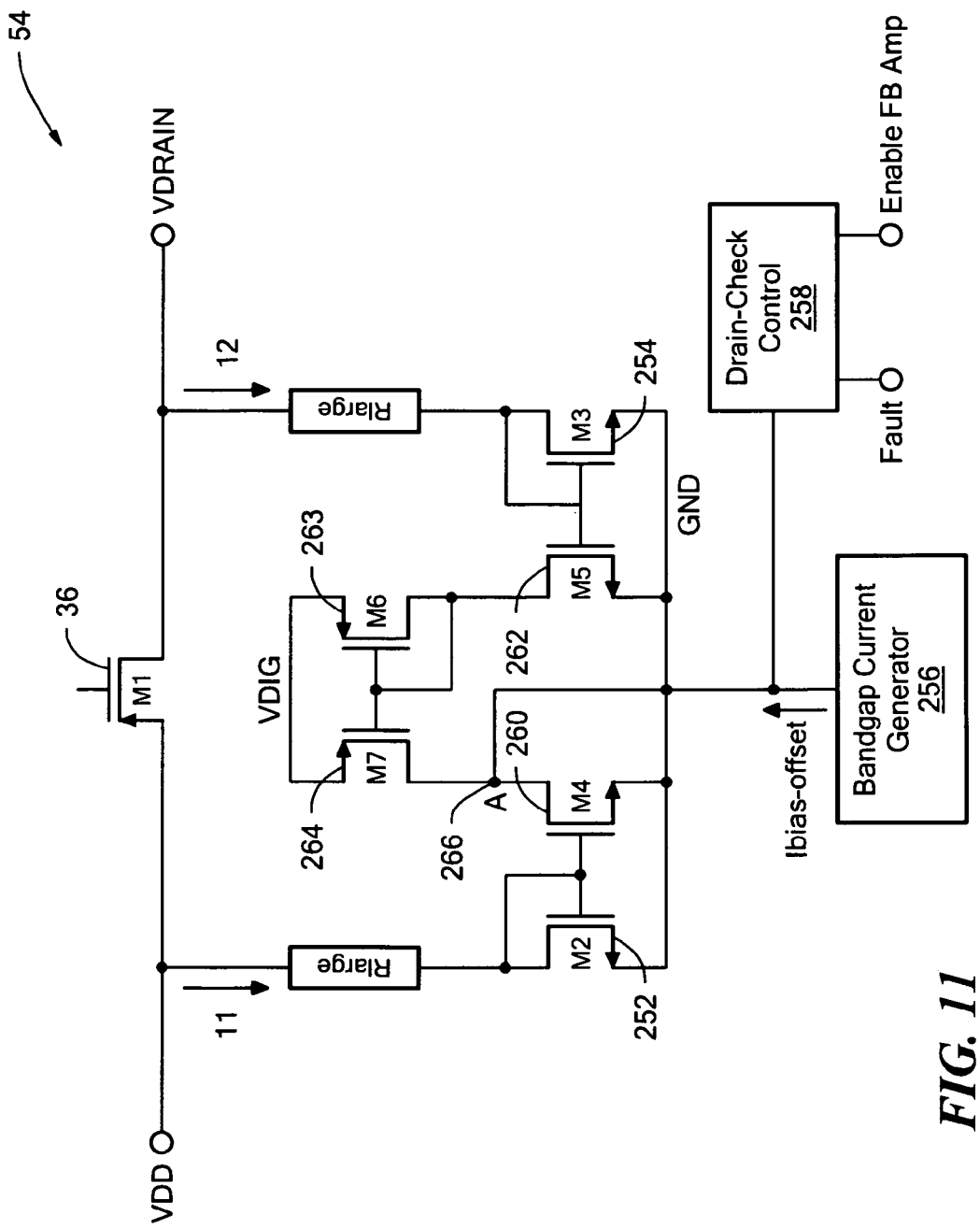
FIG. 11 is a schematic diagram of an over-current protection circuit for the active bias circuit of FIG. 2.

Over current protection circuit 54, FIG. 11, includes diode connected transistors 252 and 254 generates currents with respect the voltage on VDD and VDRAIN pins respectively. Due to the finite resistance of the switch transistor 36, current passing through it generates a voltage drop from VDD to VDRAIN. This voltage difference is measured as current difference on transistors 252 and 254 with an additional offset current generated by bandgap current generator 256. A state machine (Drain-Check control) 258 determines any over-current fault and generates fault and enable signals for the rest of the system. Over current protection circuit 250 is preferably constructed with low voltage transistors to improve matching and accuracy.

In operation, the voltage on VDD generates a stable current on transistor 252. Resistor (Rlarge) is used to limit the current dissipation on transistor 252. Current over transistor 252 is mirrored by transistor 260. The voltage on VDRAIN generates a second stable current I2 and I2 is mirrored by transistors 262-264.

An offset current Ibias-offset pushes current in to the connection node 266. If I1 is larger than Ibias-offset+I3, node 266 goes to ground. This condition indicates that the voltage drop across transistor 36 is larger than the allowed value, and system is disabled. This fault condition also arises during the first enable of the system while VDRAIN is charging. In order not to generate a false fault condition, Drain-Check control circuit 258 generates a first-rise signal of VDRAIN and does not disable the system during the first rise of VDRAIN voltage after ENABLE. The first-rise signal is kept in a register until a system wide reset signal is received. If a fault is generated after the first rise signal (over current condition), fault signal disables the switch transistor M1 and keep it switched off, until the fault condition is cleared with a LOW in the ENABLE pin, or system power-down.

Figure 12:
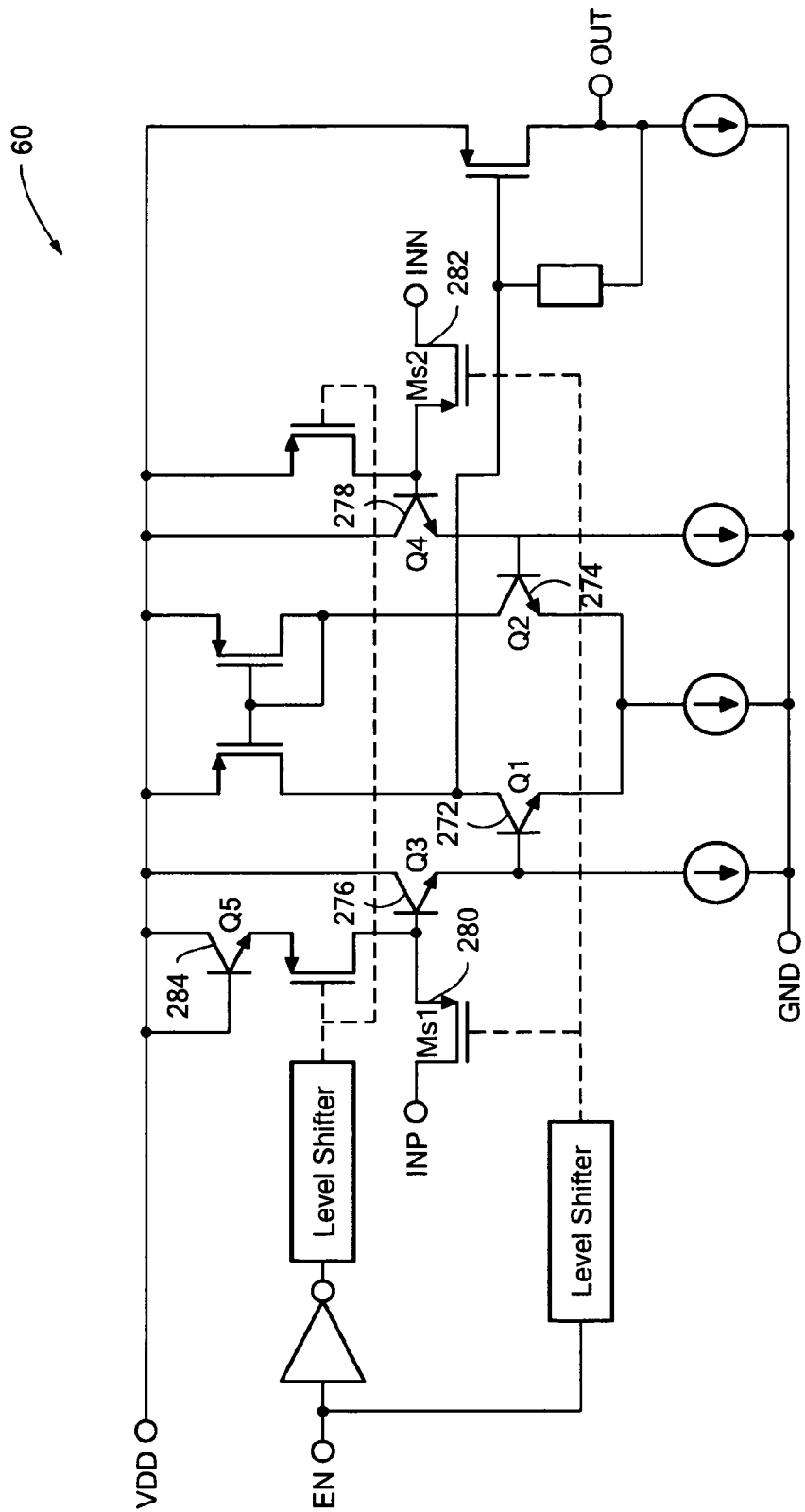
FIG. 12 is a schematic diagram of a feedback amplifier circuit for the active bias circuit of FIG. 2.

Feedback amplifier 60, FIG. 12, includes in its input stage NPN transistors 272 and 274 to improve the accuracy and mismatch of the amplifier. Since the maximum allowable VCE voltage is typically lower than the maximum supply voltage applied to the system, a second auxiliary branch created by transistors 276 and 278 is used to protect transistors 272 and 274 from an over voltage condition. The over voltage condition may occur when the feedback amplifier is disabled since the input of the feedback amplifier is at ground (due to switching 36 and sensing 44 transistors in FIG. 1) while the supply of the amplifier is still at VDD. By using series transistors 280 and 282, the input of feedback amplifier 60 is isolated from the switching 36 and sensing transistors 44 and bias with the auxiliary branch of transistors 276 and 278. When the system is enabled, the auxiliary branch is disabled and inputs are connected to switching and sensing transistors 36 and 44.

Diode connected transistor 284 generates a voltage difference between the inputs of the amplifier when the amplifier is disabled. This ensures the output of the amplifier is taken to ground when it is disabled.

Figure 13:
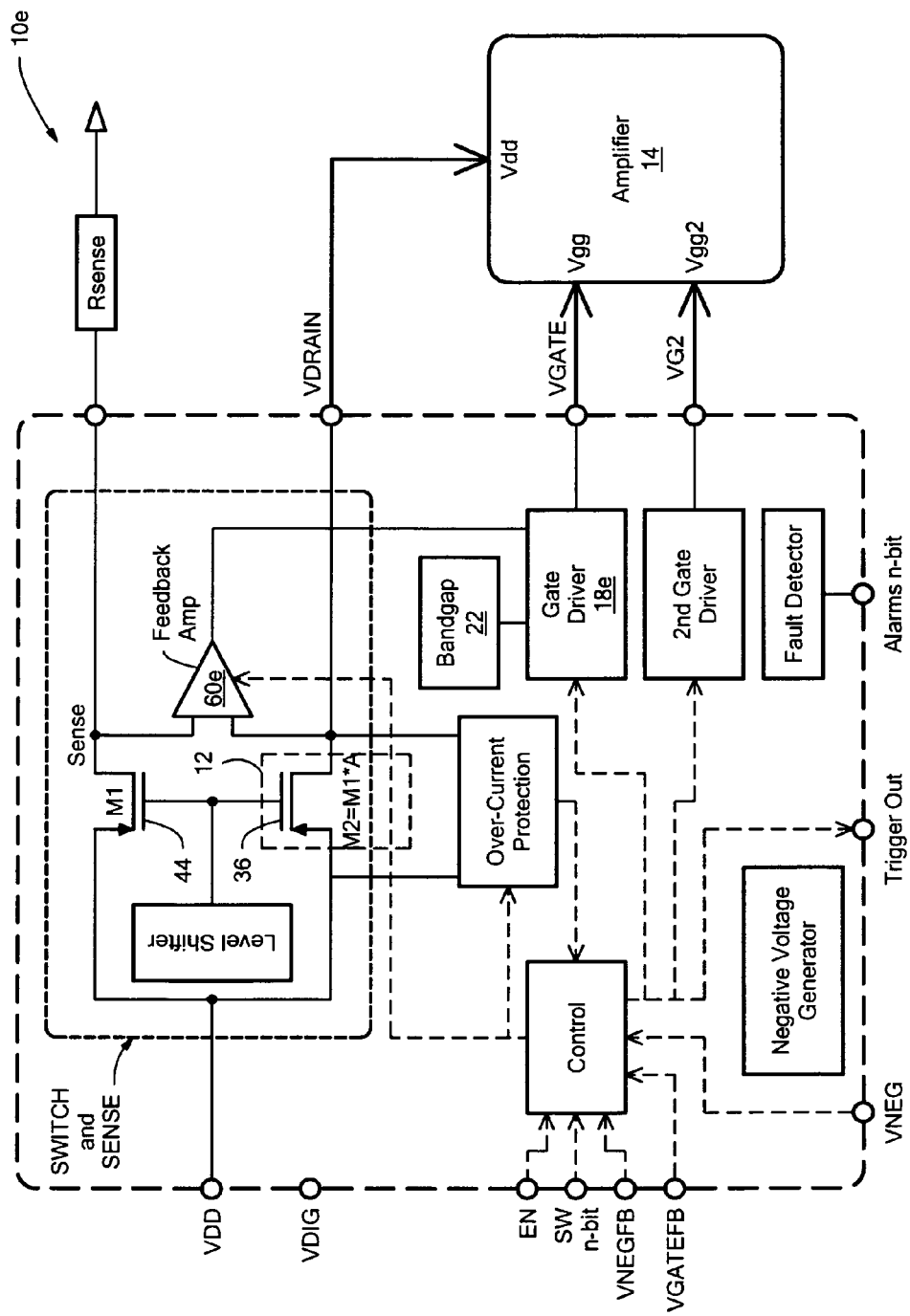
FIG. 13 is a schematic diagram of another embodiment of the active bias control circuit of FIG. 1.

In another embodiment of active bias control circuit 10e, FIG. 13, transistor 63 (from FIG. 1) is removed and feedback amplifier 60e is used to drive amplifier control circuit 18e. Amplifier control circuit 18e will adjust the gate current of amplifier 14 to equate the voltage drop across transistors 36 and 44 to each other.

Figure 14:
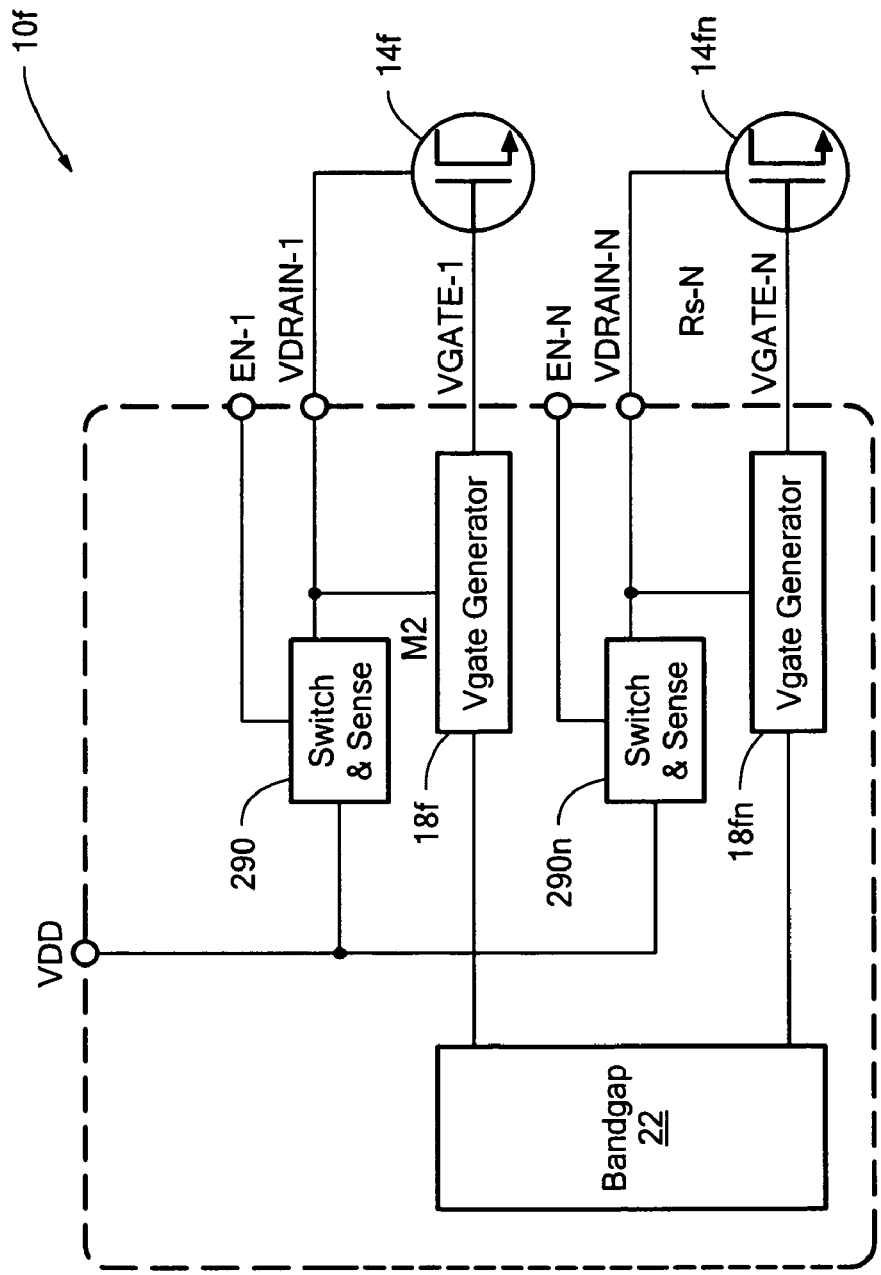
FIG. 14 is a schematic diagram of another embodiment of the active bias control circuit of FIG. 1.

In another embodiment, active bias control circuit 10f, FIG. 14, includes a plurality of bias control circuits 290f . . . 290f'' each of which includes a switch responsive to the supply voltage for providing an input supply to the corresponding amplifier, and a current sense circuit responsive for sensing a scaled down replica of the input supply to the corresponding amplifier. Active bias control circuit 10f also includes a plurality of amplifier control circuits 18f . . . 18f'' for providing a control voltage to the corresponding amplifier 14f . . . 14f'' and adjusts the control voltage in response to the sensed scaled down replica of the input current to regulate the input current to the corresponding amplifier. Each of bias control circuits 290f . . . 290f'' may be located on the same IC or in the same package. In this embodiment, all external amplifiers 14f . . . 14f'' share the same supply voltage Vdd.

Figure 15:
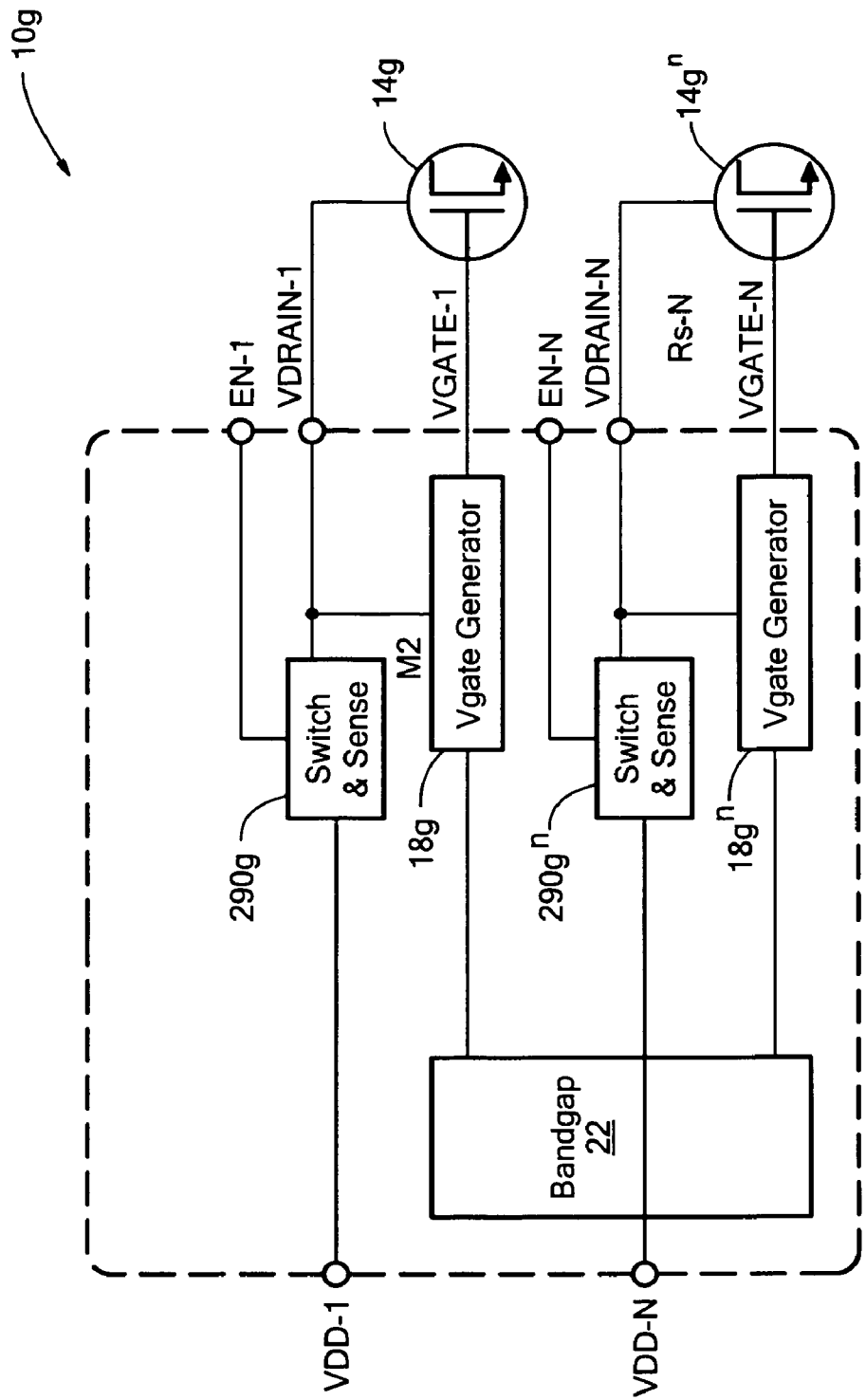
FIG. 15 is a schematic diagram of another embodiment of the active bias control circuit of FIG. 1.

In another embodiment, active bias control circuit 10g, FIG. 15, includes different supply voltages Vdd . . . Vdd'' to bias multiple corresponding amplifiers 14g . . . 14g''. Circuit 10g includes multiple bias control circuits 290g . . . 290g'' similar to circuit 10f in FIG. 14, but the bias control circuits have their own supply voltage. In this manner, multiple supply domains can be achieved. Circuit 10g may be built on chip (on a single die) or in a package with multiple dies.

Figure 16:
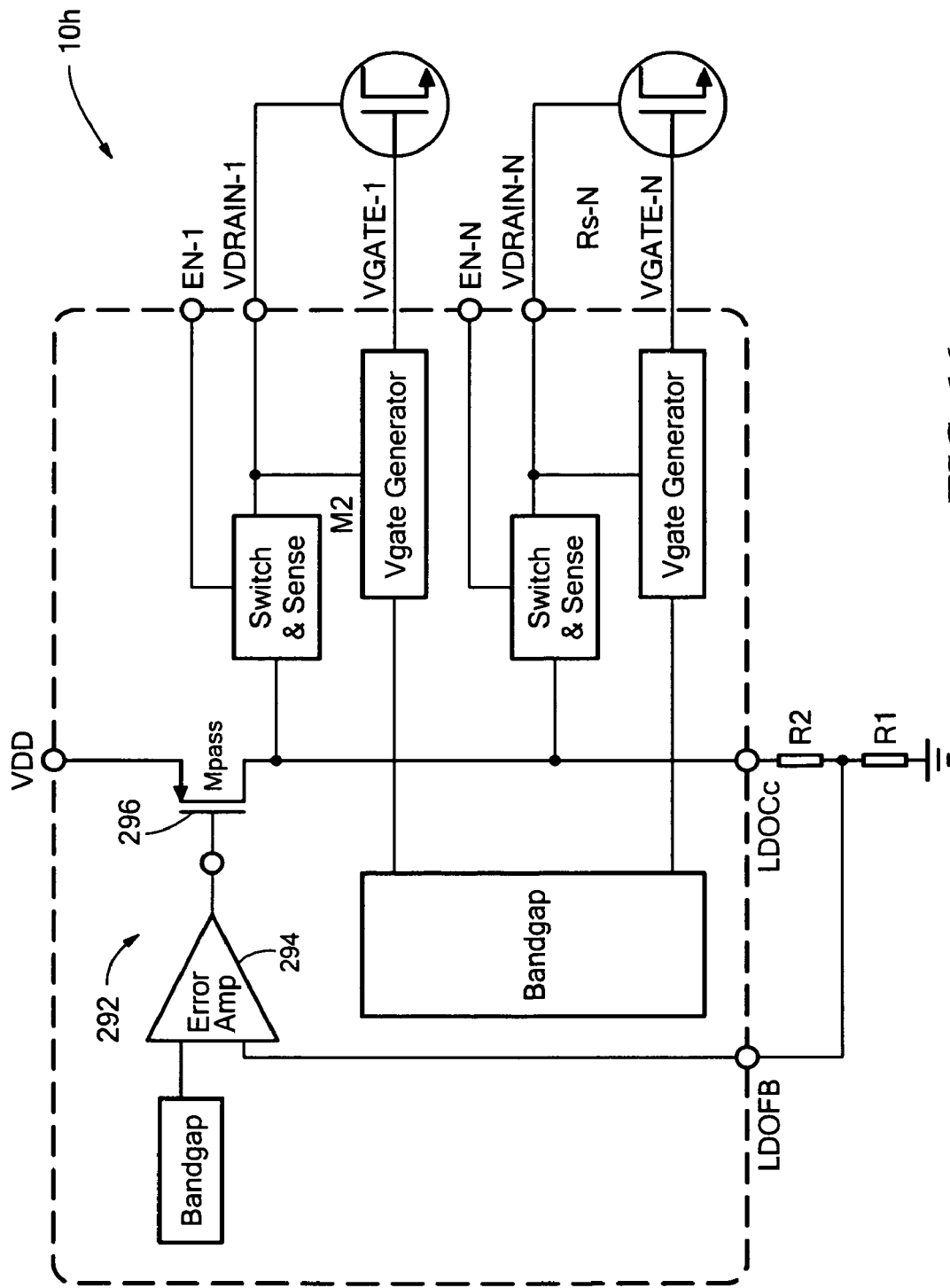
FIG. 16 is a schematic diagram of another embodiment of the active bias control circuit of FIG. 1.

In another embodiment, active bias control circuit 10h, FIG. 16, includes a low dropout regulator (LDO) 292 which includes an error amplifier 294 and pass transistor 296 to generate a stable bias voltage where VDD is different than VDRAIN. LDO 292, error amplifier 294 and transistor 296 in this embodiment are located internal in an IC.

Figure 17:
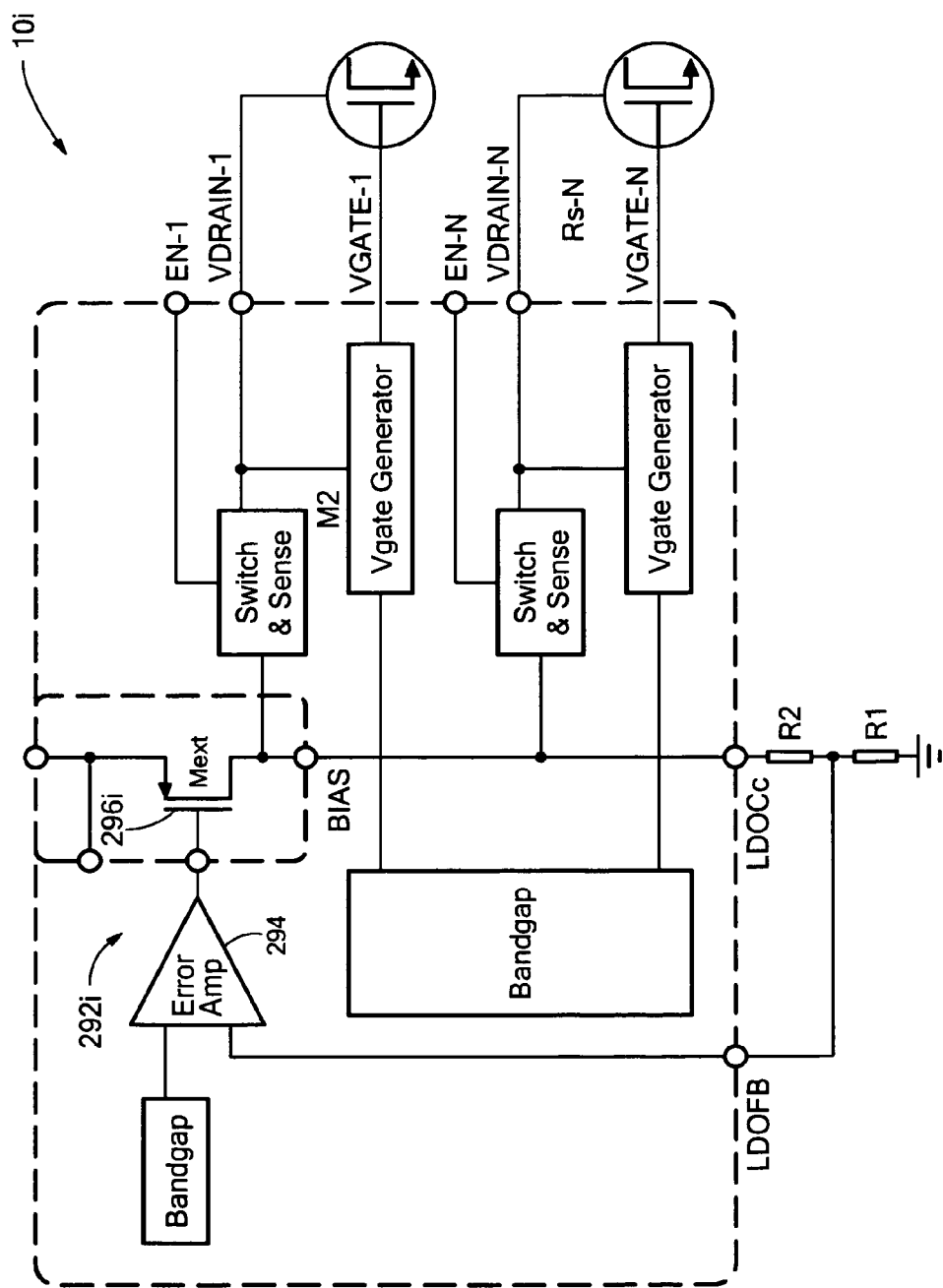
FIG. 17 is a schematic diagram of another embodiment of the active bias control circuit of FIG. 1.

In another embodiment, active bias control circuit 10i, FIG. 17, locates its pass transistor 296i external to the IC which is preferable when its current dissipation is very high. Error amplifier 294 may still be located on the IC. The circuits of FIGS. 16 and 17 are shown with multiple outputs, but the use of an LDO with either an internal or external pass transistor may also be used with a single output system.

Figure 18:
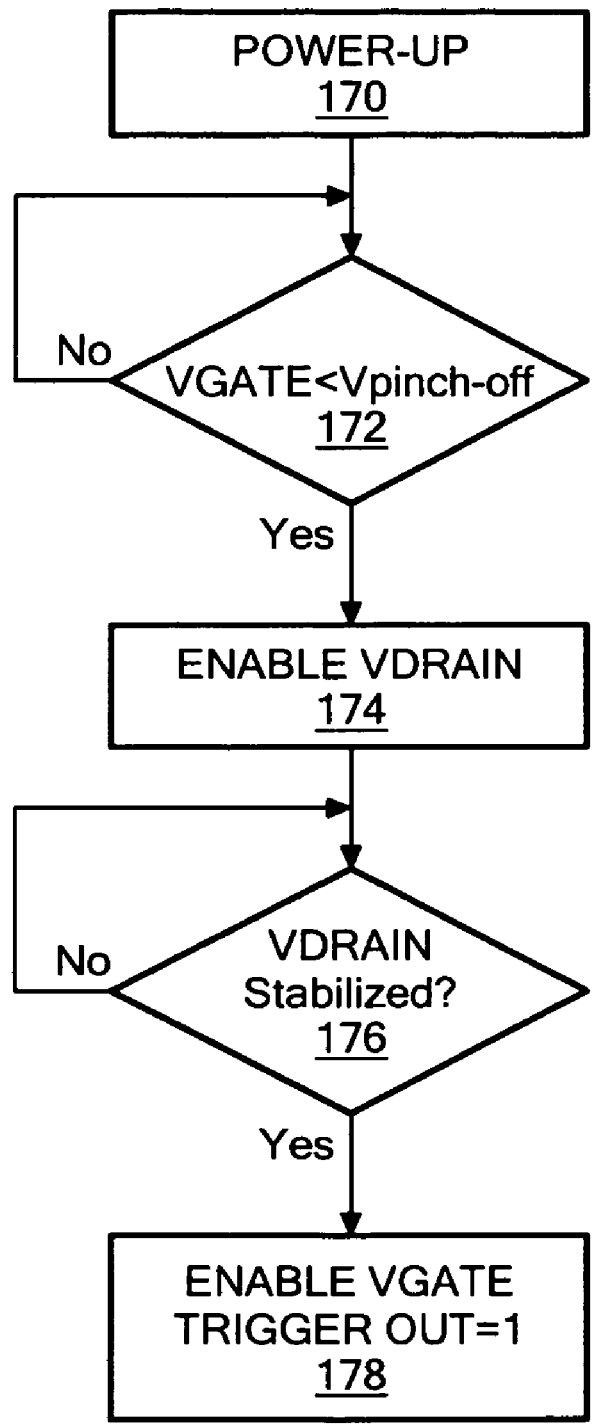
FIG. 18 is a flowchart showing one embodiment of a method of power up sequencing for the active bias control circuit of FIG. 1.

As noted in the Background of the Invention above, an important consideration for amplifiers is the proper power up sequence to be applied to the amplifier so that excess current will not pass through the amplifier damaging it. A method for power up sequencing of an active bias controller for an external amplifier shown in FIG. 18 begins at step 170 with powering up the amplifier. The control voltage of the amplifier is controlled at step 172 to bring the amplifier control voltage below pinch off. A first enable signal is generated at step 174 to enable drain current to flow to the amplifier. When it is determined at step 176 that the drain voltage has stabilized, a second enable signal is generated. In response to the second enable signal, the control voltage is enabled at step 178 to achieve a predetermined amplifier input current. A trigger out signal may also be generated when the control voltage is enabled.

Figure 19A:
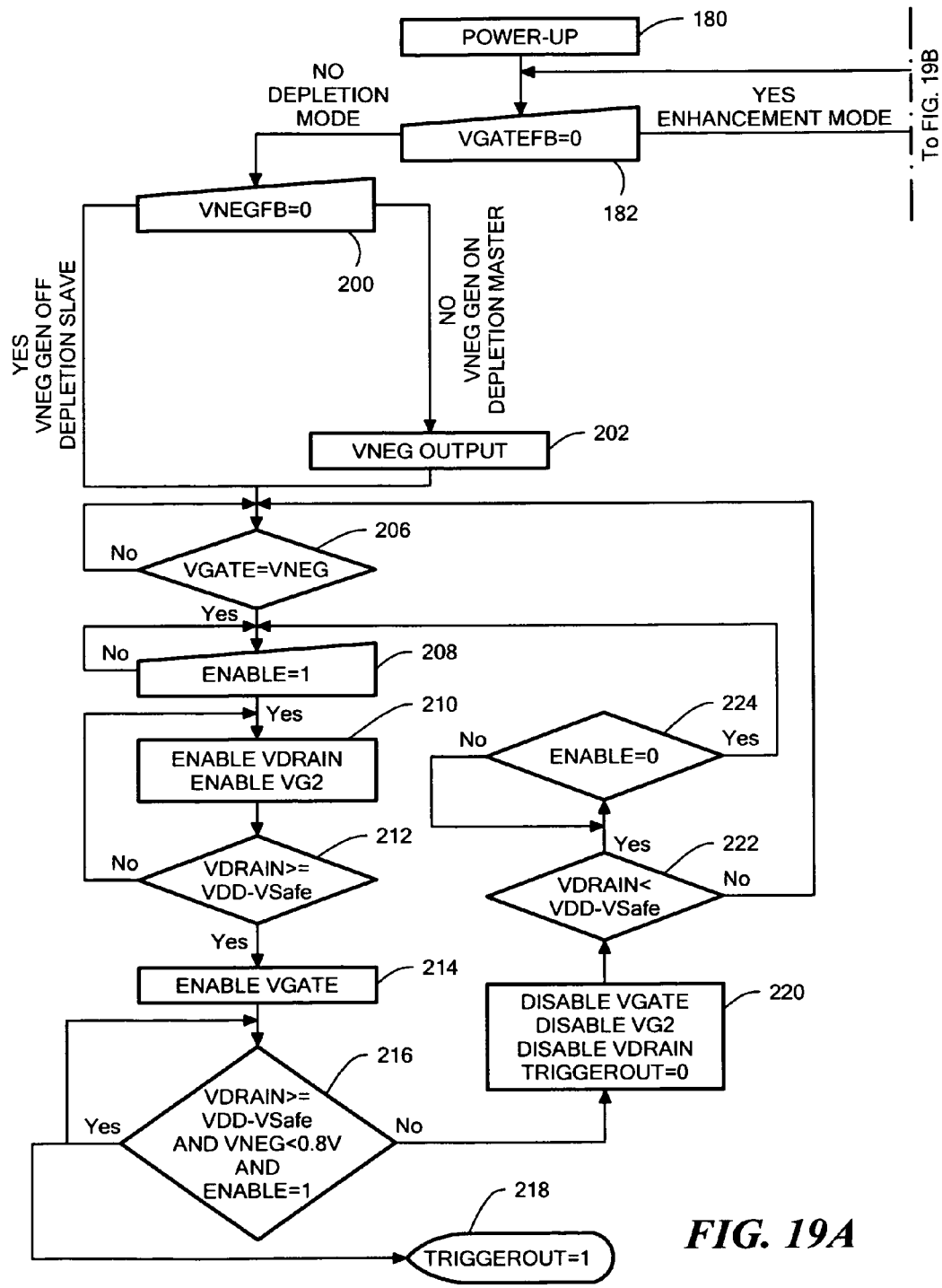
FIG. 19 is another embodiment of a method of power up sequencing for the active bias control circuit of FIG. 1.
Figure 19B:
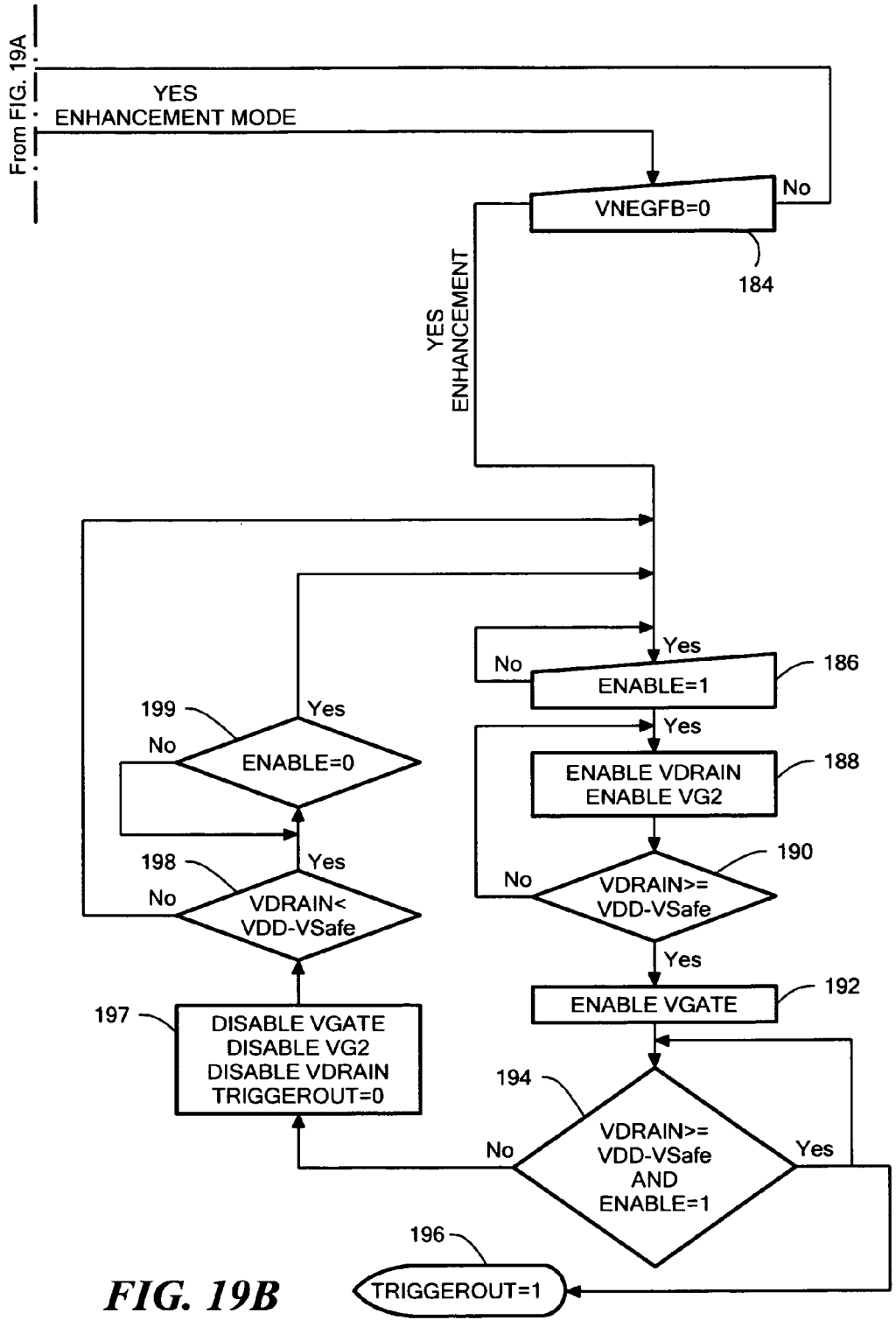
Figure 20:
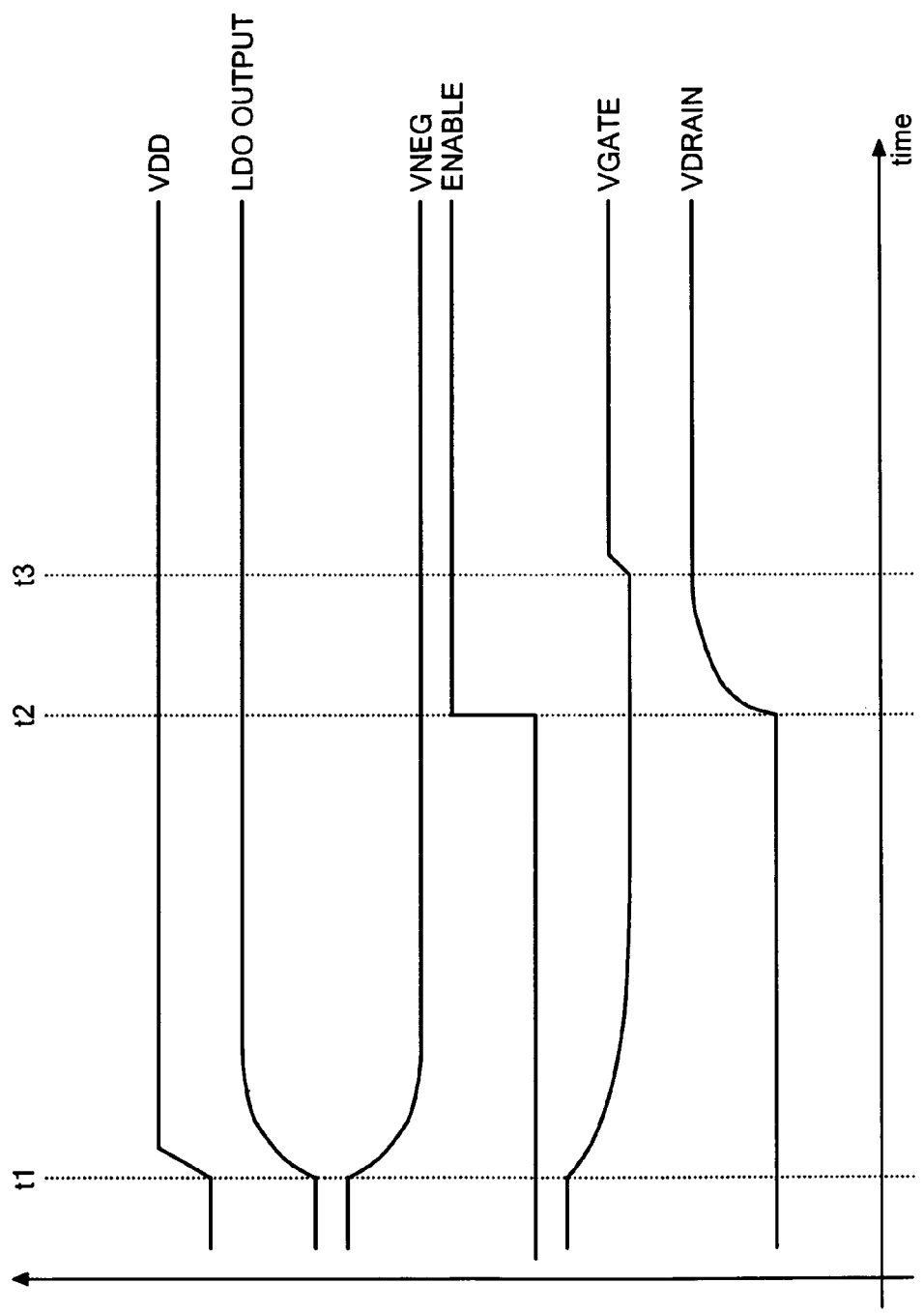
FIG. 20 is a timing diagram showing the voltages of several output signals during the method of FIG. 19.

Another embodiment of a method for power up sequencing of an active bias controller for an external amplifier is shown in the flowchart of FIG. 19 and the timing diagram of FIG. 20. This embodiment includes the features of short circuit protection and mode selection through user accessible inputs VNEGFB and VGATEFB. Active bias system is power up at step 180, time t1. At step 182, the system checks if VGATEFB input is shorted to ground. If it is grounded by the user, the system is selected to drive an ENHANCEMENT mode amplifier. The system checks at step 184 if VNEGFB input is grounded. If it is not grounded, the system waits since this mode of operation is not allowed. If the VNEGFB input is grounded, the system checks at step 186 if the user accessible pin ENABLE is HIGH. When it is HIGH at time t2, the drain voltage (VDRAIN) and gate voltage VG2 signals are enabled at step 188. The VDRAIN output is compared with respect to a VDD−Vsafe value at step 190. When VDRAIN is larger or equal to VDD−Vsafe, the gate voltage (VGATE) is enabled at step 192 and at time t3 turning on the active bias controller. During the operation, VDRAIN and ENABLE are checked continuously at step 194. A TRIGGER OUT signal is generated at step 196 when VGATE is enabled. If VDRAIN falls below the threshold or if ENABLE pin is taken to LOW, VGATE and VDRAIN are DISABLED and TRIGGER OUT is taken LOW at step 197. If VDRAIN is higher or equal to VDD−Vsafe (i.e., ENABLE is LOW) at step 198, the system goes back to the initial ENABLE state waiting for user input. If VDRAIN is smaller than VDD−Vsafe, there is a short condition, and the system waits until ENABLE is taken LOW at step 199 to clear the short condition. When ENABLE is low, system goes back to its initial state at step 186.

If at step 182 it is determined that VGATE is not grounded, the system is taken to DEPLETION mode. The system checks if VNEGFB is grounded at step 200. If it is grounded the system is taken to DEPLETION SLAVE mode, the negative voltage generator is disabled. If it is not grounded the system is taken to DEPLETION MASTER mode, and at time t1 negative voltage generator 24 is enabled at 202. VGATE is checked against predetermined value VSET at step 206. When VGATE voltage drops below VSET the system waits at step 208 for a HIGH signal on ENABLE. When ENABLE is high, VDRAIN and VG2 are enabled at step 210. The VDRAIN output is compared with respect to a VDD−Vsafe value at step 212. When VDRAIN is larger or equal to LDOCc-Vsafe VGATE is enabled at step 214 turning on the active bias controller, generating a HIGH TRIGGER OUT signal at 218. During the operation, VDRAIN, VNEG and ENABLE are compared against VDD continuously at step 216. Also, VNEG is continuously checked against an upper threshold to detect any inadvertent short to ground at VNEG. When VGATE is enabled, a HIGH TRIGGER OUT signal is generated at step 218. If VDRAIN falls below the threshold, or if ENABLE pin is taken to LOW, or if VNEG rises above −0.8V, VGATE and VDRAIN are DISABLED at step 220 and TRIGGER OUT is taken LOW. If VDRAIN is higher or equal to VDD−Vsafe (i.e., VNEG is larger than −0.8V, or ENABLE is LOW) at step 222, the system goes back to the initial ENABLE state waiting for user input. Otherwise, there is a short condition, and the system waits until Enable is taken LOW at step 224 to clear the short condition. When Enable is LOW, the system goes back to its initial state at step 208.

Figure 21A:
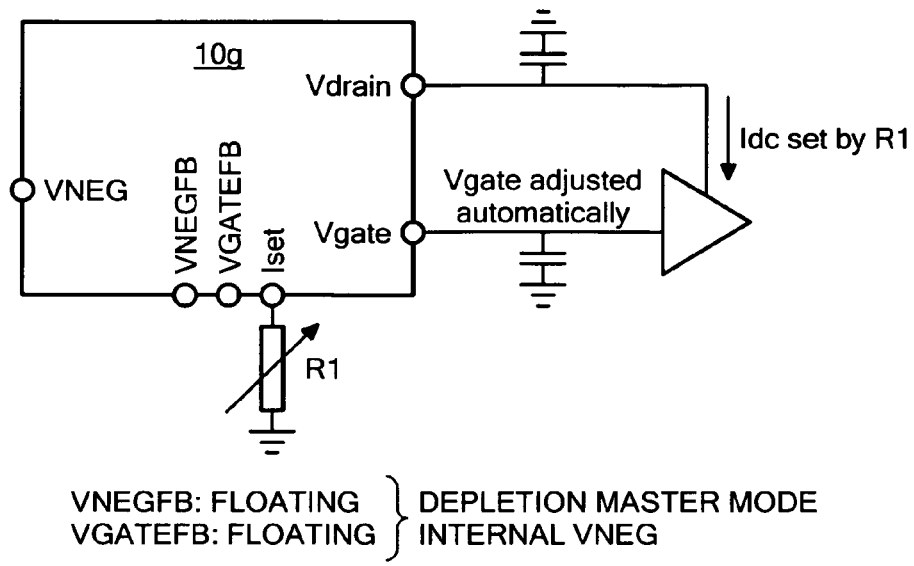
FIGS. 21A-D are schematic diagrams illustrating the operation for the active bias control circuit of FIG. 1 to obtain different modes of operating including depletion mode with either internal or external VNEG voltages, enhancement mode, or to place the system in stand-by mode.
Figure 21B:
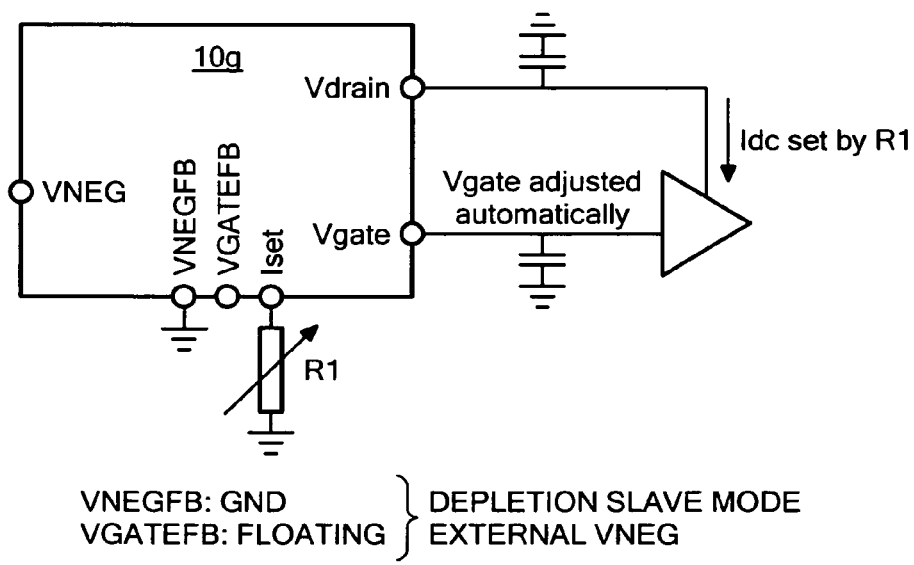
Figure 21C:
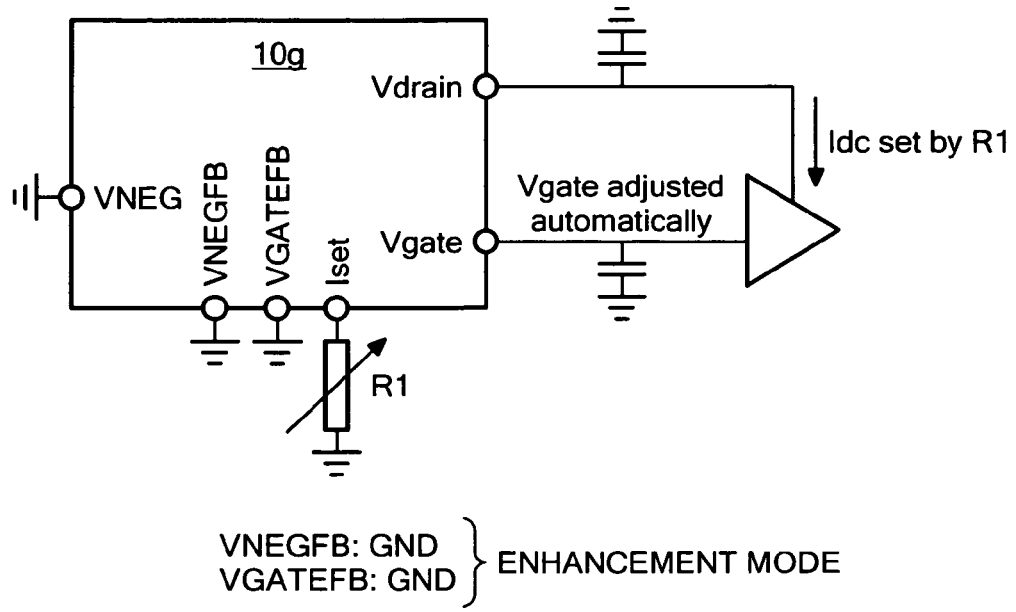
Figure 21D:
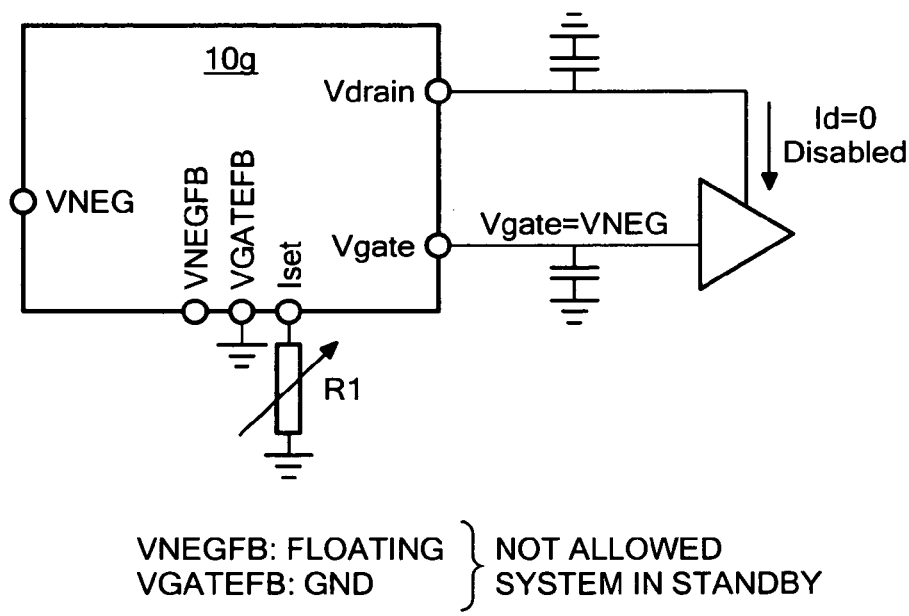

FIGS. 21A-21D illustrate how the active bias control circuit may be configured to provide the appropriate control voltage for an amplifier that includes either an enhancement mode or depletion mode device, and may be configured to either use an internal or external negative voltage supply. In FIG. 21A, when pin VNEGFB is left floating (i.e. a high signal) and a pin VGATEFB is left floating, negative voltage generator 24 is enabled and the system provides a control voltage for a depletion mode device. In FIG. 21B, when VNEGFB is shorted to ground (i.e. a low signal) and VGATEFB is left floating, negative voltage generator 24 is disabled, and the system provides a control voltage appropriate for a depletion mode device using an externally generated negative voltage. In FIG. 21C, when pin VNEGFB is shorted to ground and VGATEFB is shorted to ground, negative voltage generator 24 is disabled and the system provides the control voltage appropriate for an enhancement mode device. In FIG. 21D, when pin VNEGFB is left floating and VGATEFB is shorted to ground, negative voltage generator 24 is enabled but the active bias control circuit 10g is disabled and the system is placed in standby mode. This prevents over-current condition in depletion mode amplifier devices if the VGATEFB pin gets accidentally shorted to ground. Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An active bias control circuit for an amplifier, comprising:
   a switch including a switching transistor responsive to a supply voltage for providing an input current to the input of the amplifier;
   a level shifter for biasing the switching transistor;
   a current sense circuit coupled to the switch for sensing a scaled down replica of the input current to the amplifier; and
   a first amplifier control circuit responsive to the current sense circuit for adjusting a first control voltage to the amplifier in response to the sensed, scaled down replica of the input current to regulate the input current to the amplifier.

2. The active bias control circuit of claim 1 in which the sense circuit includes a sensing transistor having its control terminal coupled to the control terminal of the switching transistor for providing the scaled down replica of the input current to the amplifier.

3. The active bias control circuit of claim 2 in which the current sense circuit further includes a sense resistor responsive to the sensing transistor for providing a voltage corresponding to the scaled down replica of the input current to the amplifier.

4. The active bias control circuit of claim 3 further including:
   a feedback amplifier having its inputs coupled to the drains of the switching and sensing transistors, and
   a transistor coupled between the sensing transistor and the sense resistor and having a control terminal responsive to an output of the feedback amplifier for improving the current scaling accuracy of the switching and sensing transistors.

5. The active bias control circuit of claim 2 further including:
   a feedback amplifier having its inputs coupled to the drains of the switching and sensing transistors,
   the first amplifier control circuit responsive to the feedback amplifier for adjusting the first control voltage to the amplifier in response to the sensed, scaled down replica of the input current to regulate the input current to the amplifier.

6. The active bias control circuit of claim 1 further including a second amplifier control circuit for adjusting a second control voltage to the amplifier.

7. The active bias control circuit of claim 1 further including a low dropout regulator including an error amplifier responsive to a reference voltage, and a pass transistor responsive to the error amplifier for providing the supply voltage to the switch.

8. The active bias control circuit of claim 7, in which the pass transistor, the low dropout regulator and the sense circuit are located on an integrated circuit.

9. The active bias control circuit of claim 7, in which the low dropout regulator and the sense circuit are located on an integrated circuit and the pass transistor is located external to the integrated circuit.

10. The active bias control circuit of claim 1 further including one or more additional switching transistors each coupled to the switching transistor and responsive to the supply voltage for providing an input current to the input of the amplifier.

11. The active bias control circuit of claim 2 further including one or more additional sensing transistors each coupled to the sensing transistor and responsive to the supply voltage for providing the scaled down replica of the input current to the amplifier.

12. The active bias control circuit of claim 11 further including one or more additional switching transistors each coupled to the switching transistor and responsive to the supply voltage for providing an input current to the input of the amplifier.

13. The active bias control circuit of claim 1, in which the amplifier control circuit is configured to provide either a positive or negative control voltage.

14. The active bias control circuit of claim 1, in which the amplifier control circuit is configured to provide either a positive or negative control voltage.

15. The active bias control circuit of claim 2, in which the switching and sensing transistors are FET transistors.

16. The active bias control circuit of claim 2, in which the switching and sensing transistors are on a same integrated circuit and have one or more matched characteristics.

17. The active bias control circuit of claim 16, in which the matched characteristics reduce the sensitivity of performance of the active bias control circuit to variations of process, temperature, and voltage.

18. The active bias control circuit of claim 1, in which active devices of the active bias control circuit are on an integrated circuit chip, and in which the amplifier control circuit is configured to:
   provide a control voltage for an amplifier including either an enhancement mode or depletion mode device,
   operate using a negative voltage supply generated either by the integrated circuit chip or externally, and/or
   provide either a fixed control voltage or adjust the control voltage in response to a determined input current to keep the input current to the amplifier constant.

19. The active bias control circuit of claim 1, further including a control circuit configured to enable the active bias control circuit.

20. The active bias control circuit of claim 19, in which the control circuit is configured to:
   control a control voltage of the amplifier to bring the amplifier control voltage below pinch off;
   generate a first enable signal to enable input current to flow to the amplifier;
   generate a second enable signal when the supply voltage is stabilized; and
   in response to the second enable signal, increase the control voltage to achieve a predetermined amplifier input current.

21. The active bias control circuit of claim 20 in which the amplifier control circuit is disposed on an integrated circuit chip and is configured externally by user accessible pins connected to the integrated circuit chip.

22. The active bias control circuit of claim 20 in which the control circuit is configured to generate a trigger out signal after the predetermined amplifier input current is achieved.

23. The active bias control circuit of claim 21 in which the first enable signal turns on a switch to enable the input current to flow to the amplifier.

24. The active bias control circuit of claim 20 in which the second enable signal turns on an amplifier control circuit to stabilize the supply input current.

25. The active bias control circuit of claim 20 in which the control circuit is further configured to generate a trigger out signal with the second enable signal.

26. The active bias control circuit of claim 20 in which the active bias control circuit is placed in a standby mode if a negative voltage input to the active bias control circuit is shorted to ground.

27. The active bias control circuit of claim 20 in which the active bias control circuit is placed in a standby mode if a supply terminal of the amplifier is shorted to ground.

28. An active bias control circuit for a plurality of amplifiers, comprising:
- a plurality of bias control circuits each responsive to a supply voltage and each one corresponding to an amplifier, each control circuit including:
- a switch responsive to the supply voltage for providing an input current to the corresponding amplifier;
- a current sense circuit coupled to the switch for sensing a scaled down replica of the input current to the corresponding amplifier; and
- an amplifier control circuit for providing a control voltage to the corresponding amplifier and adjusting the control voltage in response to the sensed scaled down replica of the input current to regulate the input current to the corresponding amplifier.

29. An active bias control circuit for a plurality of amplifiers, comprising:
- a plurality of bias control circuits each responsive to a corresponding supply voltage and each one corresponding to an amplifier, each control circuit including:
- a switch responsive to the corresponding supply voltage for providing an input current to the corresponding amplifier;
- a current sense circuit coupled to the switch for sensing a scaled down replica of the input current to the corresponding amplifier; and
- an amplifier control circuit for providing a control voltage to the corresponding amplifier and adjusting the control voltage in response to the sensed scaled down replica of the input current to regulate the input current to the corresponding amplifier.

30. An active bias control circuit for an amplifier, comprising:
- a low dropout regulator for providing a regulated voltage;
- a switch responsive to the low dropout regulator and providing an input current to the amplifier;
- a current sense circuit responsive to the low dropout regulator for sensing a scaled down replica of the input current to the amplifier; and
- an amplifier control circuit for providing a control voltage to the amplifier and adjusting the control voltage in response to the sensed scaled down replica of the input current to regulate the input current to the amplifier.

31. An active bias control circuit for a plurality of amplifiers, comprising:
- a low dropout regulator for providing a regulated voltage;
- a plurality of bias control circuits each one corresponding to an amplifier, each control circuit including:
- a switch responsive to the low dropout regulator for providing an input current to the corresponding amplifier;
- a current sense circuit responsive to the low dropout regulator for sensing a scaled down replica of the input current to the corresponding amplifier; and
- an amplifier control circuit for providing a control voltage to the corresponding amplifier and adjusting the control voltage in response to the sensed scaled down replica of the input current to regulate the input current to the corresponding amplifier.

32. The active bias control circuit of claim 31 in which the low dropout regulator includes an error amplifier responsive to a reference voltage, and a pass transistor responsive to the error amplifier.

33. The active bias control circuit of claim 32, in which the pass transistor is located on-chip with the low dropout regulator.

34. The active bias control circuit of claim 32, in which the pass transistor is located external to a chip.

35. An active bias control circuit for an amplifier, comprising:
- a switch including a switching transistor responsive to a supply voltage for providing an input current to the input of the amplifier;
- a current sense circuit coupled to the switch for sensing a scaled down replica of the input current to the amplifier, the sense circuit including a sensing transistor having its control terminal coupled to the control terminal of the switching transistor for providing the scaled down replica of the input current to the amplifier; and
- a first amplifier control circuit responsive to the current sense circuit for adjusting a first control voltage to the amplifier in response to the sensed, scaled down replica of the input current to regulate the input current to the amplifier.

36. The active bias control circuit of claim 35 further including:
- a feedback amplifier having its inputs coupled to the drains of the switching and sensing transistors; and
- a transistor coupled between the sensing transistor and the sense resistor and having a control terminal responsive to an output of the feedback amplifier for improving the current scaling accuracy of the switching and sensing transistors.

37. The active bias control circuit of claim 35 further including:
- a feedback amplifier having its inputs coupled to the drains of the switching and sensing transistors, the first amplifier control circuit responsive to the feedback amplifier for adjusting the first control voltage to the amplifier in response to the sensed, scaled down replica of the input current to regulate the input current to the amplifier.

38. The active bias control circuit of claim 35 further including one or more additional sensing transistors each coupled to the sensing transistor and responsive to the supply voltage for providing the scaled down replica of the input current to the amplifier.

39. The active bias control circuit of claim 35, in which the switching and sensing transistors are FET transistors.

40. The active bias control circuit of claim 35, in which the switching and sensing transistors are on a same integrated circuit and have one or more matched characteristics.

* * * * *